United States Patent
Park

(10) Patent No.: US 7,791,173 B2
(45) Date of Patent: Sep. 7, 2010

(54) CHIP HAVING SIDE PAD, METHOD OF FABRICATING THE SAME AND PACKAGE USING THE SAME

(75) Inventor: Jiyong Park, Gyenggi-do (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 316 days.

(21) Appl. No.: 11/858,095

(22) Filed: Sep. 19, 2007

(65) Prior Publication Data

US 2008/0174023 A1 Jul. 24, 2008

(30) Foreign Application Priority Data

Jan. 23, 2007 (KR) ............... 10-2007-0007254
Apr. 3, 2007 (KR) ............... 10-2007-0032940

(51) Int. Cl.
*H01L 23/544* (2006.01)
*H01L 23/48* (2006.01)

(52) U.S. Cl. .............. 257/620; 257/723; 257/773; 257/786; 257/E23.02

(58) Field of Classification Search .............. 257/620, 257/723, 773, 786, E23.02
See application file for complete search history.

(56) References Cited

U.S. PATENT DOCUMENTS

| | | | | |
|---|---|---|---|---|
| 4,770,640 A | * | 9/1988 | Walter | 439/69 |
| 5,104,820 A | * | 4/1992 | Go et al. | 438/109 |
| 5,126,286 A | | 6/1992 | Chance | |
| 5,266,833 A | * | 11/1993 | Capps | 257/690 |
| 5,270,261 A | * | 12/1993 | Bertin et al. | 438/109 |
| 5,600,101 A | | 2/1997 | Sakai | |
| 5,786,237 A | | 7/1998 | Cockerill et al. | |
| 5,834,843 A | | 11/1998 | Mori et al. | |
| 5,888,884 A | * | 3/1999 | Wojnarowski | 438/462 |
| 6,287,949 B1 | | 9/2001 | Mori et al. | |
| 6,326,689 B1 | * | 12/2001 | Thomas | 257/734 |
| 6,379,999 B1 | * | 4/2002 | Tanabe | 438/113 |
| 6,607,941 B2 | * | 8/2003 | Prabhu et al. | 438/113 |
| 6,727,116 B2 | | 4/2004 | Poo et al. | |
| 7,253,527 B2 | * | 8/2007 | Tanida et al. | 257/774 |
| 2006/0006521 A1 | * | 1/2006 | Boon et al. | 257/701 |

FOREIGN PATENT DOCUMENTS

| | | |
|---|---|---|
| JP | 2001-85457 | 3/2001 |
| JP | 2002-076167 | 3/2002 |
| KR | 2001-0073946 | 8/2001 |

\* cited by examiner

*Primary Examiner*—Nitin Parekh
(74) *Attorney, Agent, or Firm*—Muir Patent Consulting, PLLC

(57) ABSTRACT

A semiconductor device includes a first chip having a top surface, a bottom surface and a side surface connected to the top and bottom surfaces. The first chip includes a chip substrate; a lower conductive pattern over the chip substrate; an interlayer dielectric layer over the lower conductive pattern; and an upper conductive pattern over the interlayer dielectric layer. At least a portion of the lower conductive pattern and at least a portion of the upper conductive pattern are exposed on the side surface of the first chip to collectively form a side pad.

24 Claims, 26 Drawing Sheets

CHIP HAVING SIDE PAD, METHOD OF FABRICATING THE SAME AND PACKAGE USING THE SAME

This application claims priority from Korean Patent Application No. 2007-0007254, filed on Jan. 23, 2007 and No. 2007-0032940, filed on Apr. 3, 2007, the contents of which are incorporated herein by reference in their entirety.

BACKGROUND

1. Field of Invention

Embodiments of the present invention generally relate to semiconductor devices, methods of fabricating the same and packages using the same. More particularly, embodiments of the present invention relate to semiconductor devices having side pads, methods of fabricating the same and packages using the same.

2. Description of the Related Art

As electronic products continue to decrease in size and increase in capability, semiconductor packages within the electronic products must be manufactured to have a small size and high performance. FIG. 1 is a perspective view of conventional wafer having a plurality of conventionally-formed chips 10.

Referring to FIG. 1, one of the conventional chips 10 has a plurality of chip pads 40 on an upper surface 20 thereof, which may be an active surface where various electrical components are formed. Through the chip pads 40 signals can be transmitted between electrical components formed within the chip 10 and external devices (not shown).

However, as performance demands, memory capacity, integration and miniaturization of semiconductor packages increase, the density of chip pads 40 inevitably increases. As a result, it becomes more difficult to adequately form the chip pads 40 on the upper surface 20. For example, it becomes difficult to form redistribution patterns over the upper surface 20 in a desirable manner due to the constraint on the available area of the upper surface 20 that can be occupied by the redistribution patterns.

Lastly, the chip 10 is electrically bonded to an underlying circuit substrate (not shown) using either external contact terminals such as bonding wires or solder balls. In the case of using the bonding wires, the chip 10 is arranged such that the chip pads 40 are above the upper surface 20 and the bonding wires are bonded between the chip pads 40 and substrate pads such as bond fingers on the circuit substrate. When using the solder balls, the chip 10 is flipped such that the chip pads 40 are below the upper surface 20 and solder balls are bonded between the chip pads 40 and substrate pads on the circuit substrate.

When wire bonding the chip 10 to the underlying circuit substrate, the bonding wires extend above the chip surface 20. On the other hand, when the chip 10 is bonded to the underlying circuit substrate using solder balls, the solder balls increase a distance between the chip 10 and the circuit substrate. In either case, the thickness of the resultant semiconductor package is substantially greater than the combined thickness of the chip 10 and the underlying circuit substrate. The present invention addresses these and other disadvantages of the conventional art.

SUMMARY

One exemplary embodiment of the present invention can be characterized as a semiconductor device that includes a first chip having a top surface, a bottom surface and a side surface connected to the top and bottom surfaces. The first chip may include a chip substrate, a lower conductive pattern over the chip substrate, an interlayer dielectric layer over the lower conductive pattern and an upper conductive pattern over the interlayer dielectric layer. At least a portion of the lower conductive pattern and at least a portion of the upper conductive pattern may be exposed on the side surface of the first chip to collectively form a side pad.

Another exemplary embodiment of the present invention can be characterized as a method of forming a semiconductor device that includes forming a first chip having a top surface, a bottom surface and a side surface connected to the top and bottom surfaces. The first chip may be formed by providing a chip substrate, forming a lower conductive pattern over the chip substrate, forming an interlayer dielectric layer over the lower conductive pattern and forming a upper conductive pattern over the interlayer dielectric layer. At least a portion of the lower conductive pattern and at least a portion of the upper conductive pattern may be exposed on the side surface of the first chip to collectively form a side pad.

BRIEF DESCRIPTION OF THE DRAWINGS

Hereinafter, embodiments of the present invention will be described with reference to the accompanying drawings, in which.

DETAILED DESCRIPTION

Figure 1:
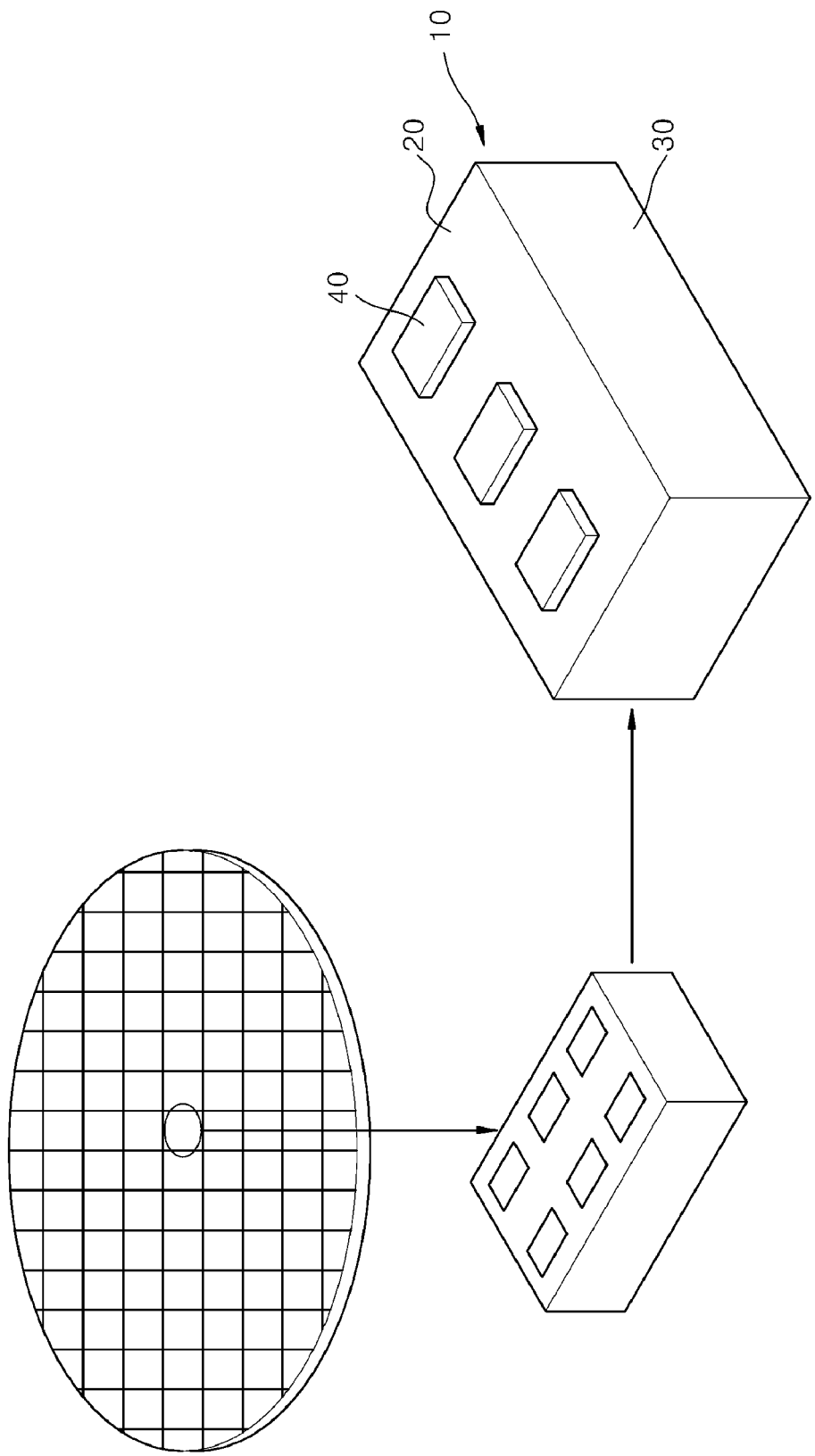
FIG. 1 is a perspective view of conventional wafer having a plurality of conventional chips, each having conventional pads.

Exemplary embodiments of the present invention will now be described more fully hereinafter with reference to the accompanying drawings. These embodiments may, however, be realized in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity Like numbers refer to like elements throughout the specification.

Figure 2A:
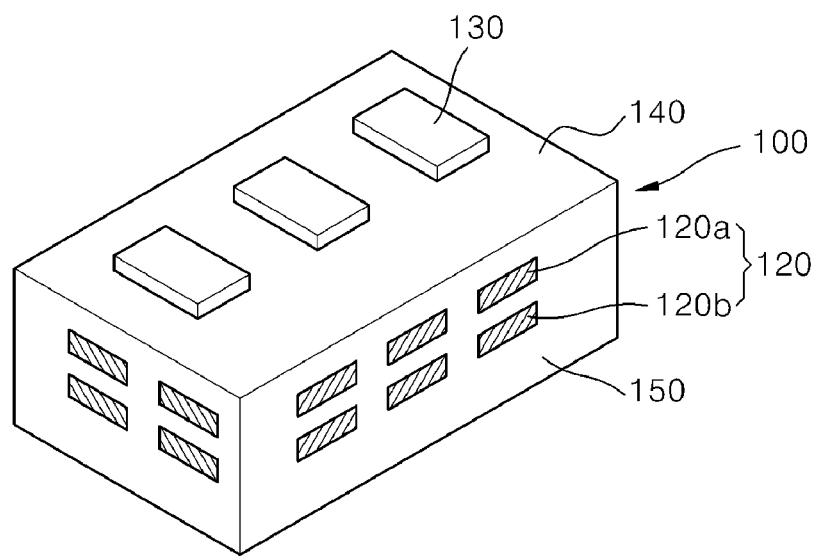
FIGS. 2A and 2B are perspective views of a chip having side pads according to some embodiments.
Figure 2B:
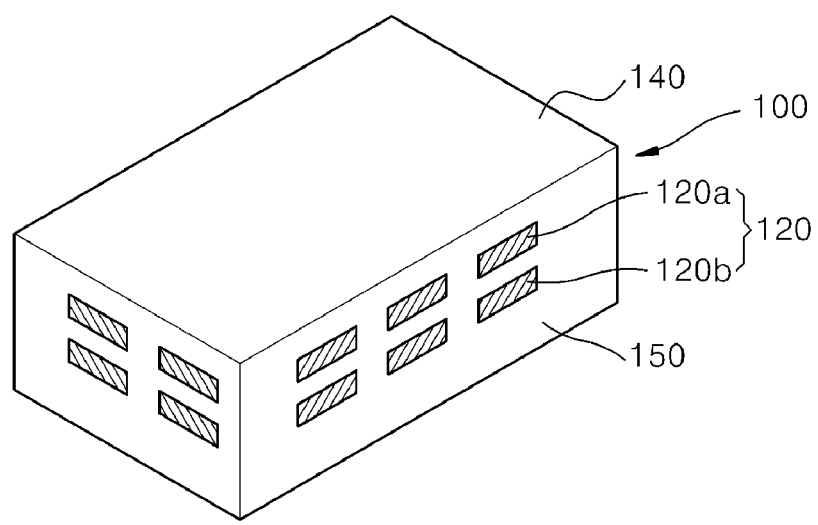

FIGS. 2A and 2B are perspective views of a chip having side pads according to some embodiments.

Referring to FIG. 2A, a chip 100 as shown may be a logic chip, a memory chip, or the like or a chip having combined functionalities thereof such as system-on-a-chip (SOC). According to one embodiment, for example, the chip 100 may include a top surface 140, a bottom surface (not shown) opposite the top surface 140, and a plurality of side surfaces 150 connecting the top surface 140 and the bottom surface. In FIG. 2A, the chip 100 is shown to have four side surfaces 150. However, the chip 100 may have any number of side surfaces as desired within the spirit and scope of the present invention. For example, the chip 100 may only need to have at least three side surfaces 150. A plurality of side pads 120 are formed on one or more of the plurality of side surfaces 150 using one or more conductive layers for forming interconnections (also referred to herein as conductive patterns) and/or via patterns generally formed in the chip 100 as will be explained further below.

Figure 3A:
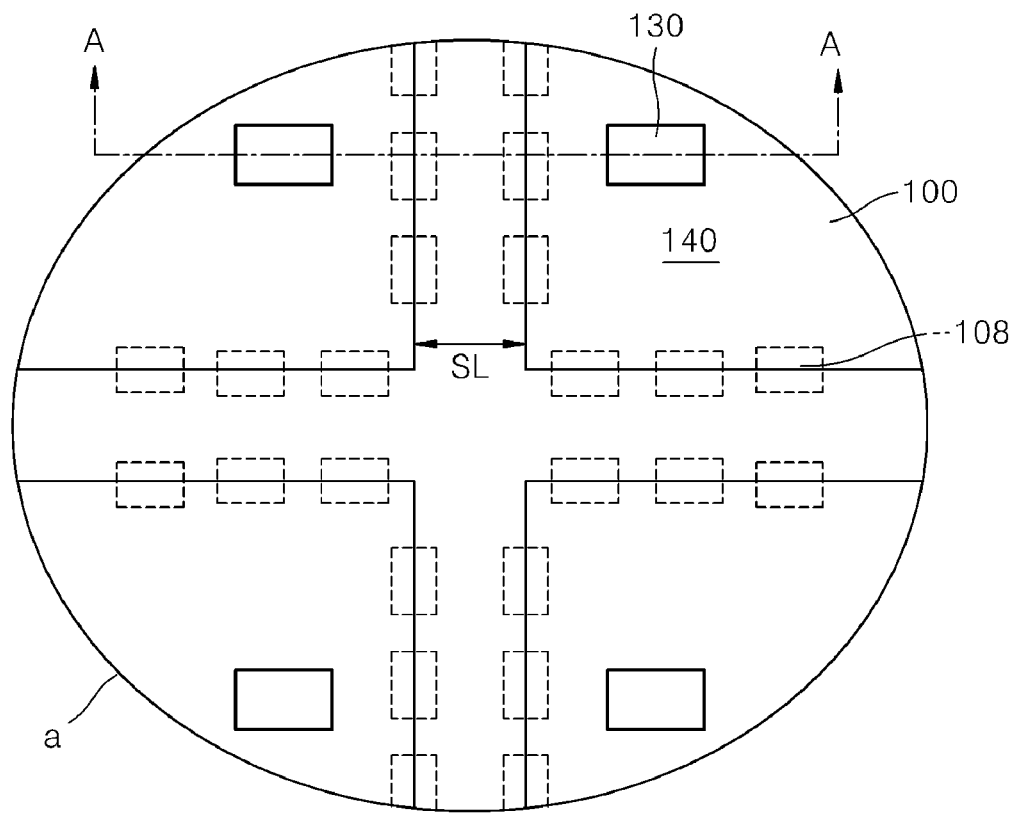
FIG. 3A is a plan view of an arrangement of pads provided within chips located on a wafer.
Figure 3B:
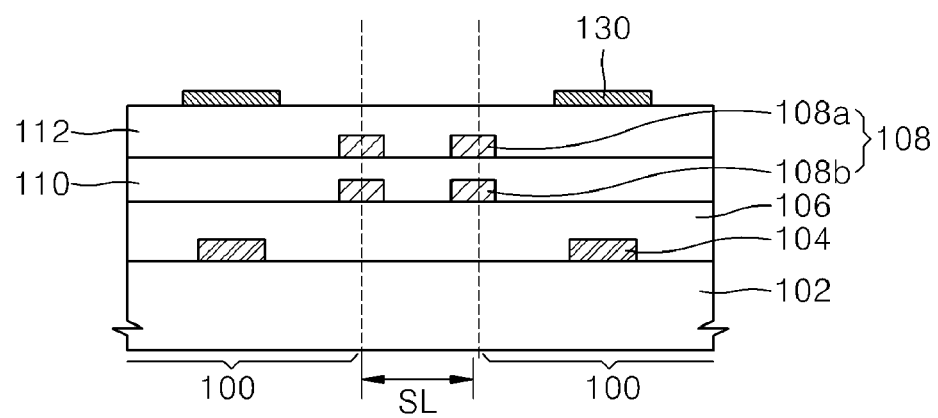
FIG. 3B is a cross-sectional view taken along line "A" shown in FIG. 3A.

The chip 100 includes a chip substrate or a semiconductor substrate (not illustrated in FIG. 2A but illustrated in FIG. 3B). Conductive patterns including a material such as Al, Cu, W, Mo, conductive metal nitrides such as TiN, TaN or WN are exposed through the side surfaces 150 to form the plurality of side pads 120. In one embodiment, the chip 100 also includes a lower conductive pattern 120b over the chip substrate, an interlayer dielectric layer (e.g., 110 of FIG. 4C) over the lower conductive pattern 120b, and an upper conductive pattern 120a over the interlayer dielectric layer.

According to one embodiment, at least a portion of the lower conductive pattern 120b and/or at least a portion of the upper conductive pattern 120a are exposed on at least one of side surfaces 150 of the chip 100 to form the side pads 120. For example, at least a portion of the upper conductive pattern 120a is disposed vertically between the top surface 140 of the chip 100 and the lower conductive pattern 120b. In detail, the portion of the upper conductive pattern 120a exposed on the side surface 150 of the chip 100 may be disposed between the portion of the lower conductive pattern 120b exposed on the side surface 150 of the chip 100 and the top surface 140 of the chip 100.

Although the side pad 120 is described as including two conductive patterns, it will be appreciated that the side pad 120 may include any number of conductive patterns i.e., one or more conductive patterns. However, two or more conductive patterns for side pads 120 may be effective in reducing a contact resistance between the side pads 120 and contact terminals, e.g., conductive interconnects 312 shown in FIG. 13B, and to increase an alignment margin between the side pads 120 and the contact terminals. Also, with two or more conductive patterns, the solderability between the side pads 120 and the contact terminals can be improved.

The width and the thickness of the upper conductive pattern 120a and the lower conductive pattern 120b may be determined depending on factors such as the shape of the chip 100, the kinds of the packages, and the manufacturing processes to form electrical components within the chip 100.

Also, the side pad 120 may be substantially coplanar with the one of the plurality of side surfaces 150 of the chip 100 or may protrude therefrom. Alternatively, the side pad 120 may be recessed from the side surface 150 of the chip 100 depending on applications.

According to one embodiment, a dielectric material is disposed between the upper conductive pattern 120a and the lower conductive pattern 120b. Alternatively, additional conductive pattern may be disposed between the conductive pattern 120 and the lower conductive pattern 120b as will be described below.

In one embodiment as exemplarily shown in FIG. 2A, chip pads 130 may be disposed over the top surface 140 of the chip 100. The chip pads 130 may be electrically connected to the conductive structure 104 and/or any of the conductive patterns 108 by an electrically conductive interconnect structure (not shown). It will be appreciated, however, that the chip 100 need not include chip pads 130. Such an alternative embodiment is exemplarily shown in FIG. 2B.

FIG. 3A is a plan view of an arrangement of pads provided within chips 100. FIG. 3B is a cross-sectional view taken along line "A" shown in FIG. 3A.

Referring to FIGS. 3A and 3B, a plurality of chips 100 may generally be formed together on the same substrate "a" (e.g., a semiconductor wafer) using conventional fabrication techniques. The plurality of chips 100 are formed in chip areas. The chip areas are spaced apart from each other on the substrate by a dicing area (i.e., an area indicated by a scribe line SL) having a substantially uniform width as known to one skilled in the art. Each chip 100 may include a plurality of conductive patterns 108. A first portion of each conductive pattern 108 is over a region of the substrate occupied by a chin 100 and a second portion of each conductive pattern 108 is over a region of the substrate occupied by the dicing area, i.e., the scribe line SL. A cross-sectional view of an end portion of conductive patterns 108 is exemplarily indicated by the dashed lines defining the rectangular forms.

Referring to FIG. 3B, each chip 100 may, for example, include a conductive structure 104 formed over a semiconductor substrate (herein illustrated as 102), a first interlayer dielectric layer 106 and the aforementioned conductive pattern 108. In one embodiment, the conductive structure 104 may, for example, include electrical components such as cell transistors, core transistors, peripheral transistors, storage capacitors, or the like or a combination thereof. In another embodiment, the conductive structure 104 may include other structures such as interconnection lines, contacts, or the like or a combination thereof, which can be coupled to electrical components. In one embodiment, the first interlayer dielectric layer 106 may, for example, include an oxide (e.g., $SiO_2$), a low-k material (e.g., SiCOH), or the like or a combination thereof.

As more clearly shown in FIG. 3B the chip 100 may, for example, include an upper conductive pattern 108*a* and a lower conductive pattern 108*b* as the plurality of conductive patterns 108.

According to some embodiment, the conductive patterns may be bit lines or interconnection lines connecting to cell regions of a memory device, peripheral regions of a memory device, or other electrical components known to one skilled in the art, or the like or a combination thereof. In one embodiment, the conductive patterns for forming side pads may be formed after the bit lines are formed. According to some other embodiments, the conductive patterns 108 may be via patterns, dummy lines, transistors such as a dummy transistor, or the like or a combination thereof. Therefore, even the portions of the dummy transistor can be used to form side pads 120, for example, shown in FIG. 2A. Portions of both the upper conductive pattern 108*a* and the lower conductive pattern 108*b* extend over a region of the semiconductor substrate 102 represented by the scribe line SL. The thickness of the upper conductive pattern 108*a* or the thickness of the lower conductive pattern 108*b* may be at least about 1 μm or greater. Preferably, the thickness of the upper conductive pattern 108*a* and the lower conductive pattern 108*b* may be from about 1 μm to about 2 μm. However, the present invention is not limited to this specific thickness range and it would be acceptable as long as the combined thickness of the upper conductive pattern 108*a* and the lower conductive pattern 108*b* provides the side pads 120 having a sufficient contact area to contact the conductive interconnect 312 as exemplarily shown in FIG. 13B.

Also, the upper conductive pattern 108*a* and the lower conductive pattern 108*b* may be formed while forming other device structures such as the interconnection line. For example, the conventional interconnection line and the conductive pattern 108 for the side pads 120 can be formed in the same process by simply adding additional patterns to a mask for forming the interconnection line. Therefore, additional mask to form the upper conductive pattern 108*a* and lower conductive pattern 108*b* may be omitted. Thus, the prevent invention can be implemented without incurring additional manufacturing costs.

A second interlayer dielectric layer 110 may be disposed between the upper conductive pattern 108*a* and the lower conductive pattern 108*b* and a third interlayer dielectric layer 112 may be disposed over the lower conductive pattern 108*b*.

In general, multiple interconnection levels are required between power and ground metallization and the chip pads (e.g., 40 as shown in FIG. 1), which are formed on a top of the chip 100 or between the chip pads 130 and the underlying conductive structures such as cell transistors, core transistors, peripheral transistors, storage capacitors, etc. Further, in the prior art, as the power or ground metallization is connected to a plurality of chip pads 130, rather than a single pad considering the resistance and the disturbance, metallization routing for power or ground have been typically highly complicated and lengthy. Each interconnection level has associated with it a certain electrical resistance that is proportional to the length of the interconnection level and that contributes to a signal delay.

By providing the side pads 120 as exemplarily described above, however, the number of interconnection levels, and length of the interconnection can be significantly reduced as the power or ground metallization or signal lines can be connected to the side pads (bonding pads) 120 in a shorter distance than the prior art without having to go through the chip pads 130 disposed on a top of the chip 100. As a result, the electrical resistance and the signal delay can be significantly reduced. In addition, the complexity of the signal paths between the conductive structures and the external signal sources (e.g., power sources, ground, ordinary signal sources, etc.) can be reduced by providing the side pads 120. These features according to some embodiments of the present invention will be further discussed with reference to FIGS. 12A through 12C.

Figure 4A:
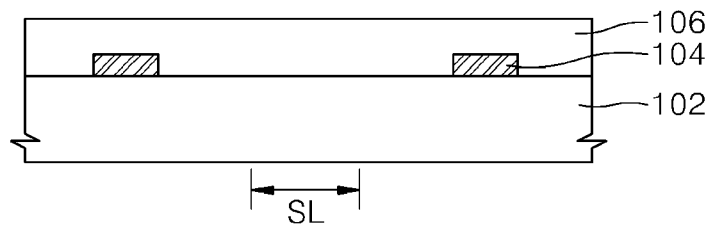
FIGS. 4A-4C are cross-sectional views illustrating an exemplary method of forming the chip shown in FIG. 2A.
Figure 4B:
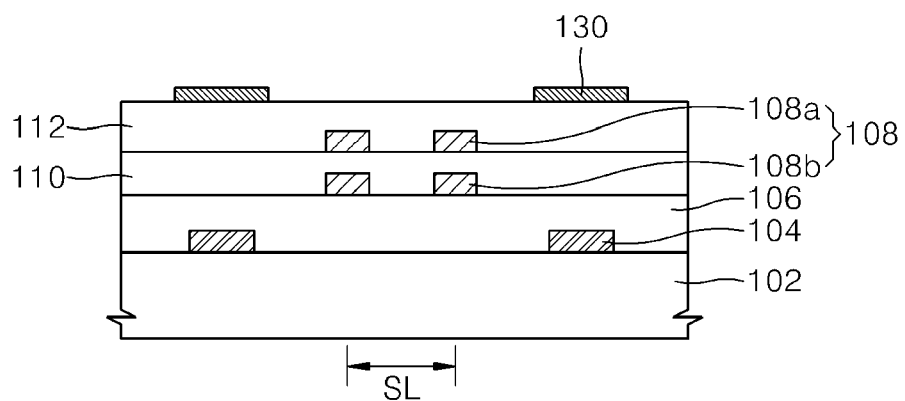
Figure 4C:
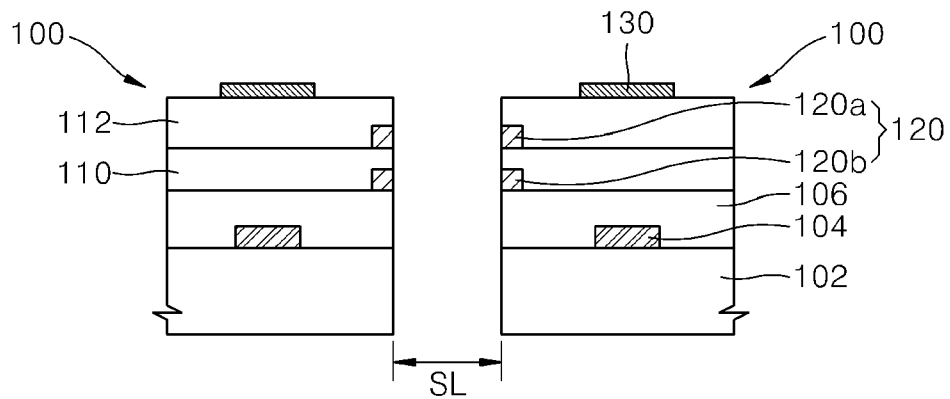

FIGS. 4A-4C are cross-sectional views illustrating an exemplary method of forming the chip shown in FIG. 2A.

A method of forming the chip shown in FIG. 2A can be generally characterized as forming a chip 100 having a top surface 140, a bottom surface (not illustrated) and a side surface 150 connected to the top surface 140 and the bottom surface.

Referring to FIG. 4A, the chip 100 may be formed by, for example, providing a semiconductor substrate or a chip substrate 102, forming a conductive structure 104 on the semiconductor substrate 102 as is well known to one skilled in the art. As described above, in one embodiment, the conductive structure 104 may, for example, include electrical components such as cell transistors, core transistors, peripheral transistors, storage capacitors, or the like or a combination thereof. In another embodiment, the conductive structure 104 may include conductive structures such as interconnection lines, contacts, or the like or a combination thereof, which can be coupled to the electrical components.

Next, the first interlayer dielectric layer 106 may be formed over the resultant structure including the semiconductor substrate 102 and the conductive structure 104. In one embodiment, the first interlayer dielectric layer 106 may be formed by depositing electrically insulating material and planarizing the upper surface of the electrically insulating material, for example, by chemical mechanical polishing (CMP). In one embodiment, the electrically insulating material may, for example, include an oxide (e.g., $SiO_2$), a low-k material (e.g., SiCOH), or the like or a combination thereof.

Referring to FIG. 4B, conductive patterns 108 may be formed over the first interlayer dielectric layer 106. In one embodiment, conductive patterns 108 may be formed by sequentially forming the lower conductive pattern 108*b* on the first interlayer dielectric layer 106, forming a second interlayer dielectric layer 110 on the lower conductive pattern 108*b*, forming the upper conductive pattern 108*a* on the second interlayer dielectric layer 110, and forming a third interlayer dielectric layer 112 on the upper conductive pattern 108*a*.

In one embodiment, the second interlayer dielectric layer 110 and the third interlayer dielectric layer 112 may be formed in a manner substantially the same or similar to the manner in which the first interlayer dielectric layer 106 was formed. The upper conductive pattern 108a and the lower conductive pattern 108b may be formed by depositing a conductive material over an underlying interlayer dielectric layer and patterning the conductive material such that at least a portion of each conductive pattern 108 is disposed over the region of the semiconductor substrate 102 occupied by the scribe line SL. Each conductive pattern 108 may be electrically connected to one or more other conductive patterns 108 within the chip 100.

In summary, the chip 100 may be formed by providing a semiconductor substrate or a chip substrate 102, forming a lower conductive pattern 120b over the chip substrate 102, forming an interlayer dielectric layer over the lower conductive pattern 120b, and forming an upper conductive pattern 120a over the interlayer dielectric layer. At least a portion of the lower conductive pattern 120b and at least a portion of the upper conductive pattern 120a may be exposed on the side surface of the chip 100 to collectively form a side pad 120. The lower conductive pattern 108a and upper conductive pattern 108b may be formed while other devices or interconnection structures are formed as described above and further below.

After forming the conductive pattern 108, the chip pads 130 may be formed over the third interlayer dielectric layer 112 using conventional techniques. As mentioned above, the chip pads 130 may be electrically connected to the conductive structure 104 and/or any of the conductive patterns 108. Accordingly, the chip pads 130 may be electrically connected to the side pads 120.

According to some embodiments, the conductive patterns 108 may be formed in the same processing steps used to form bit lines, interconnection lines coupled to cell or peripheral regions of a memory device, via patterns, dummy lines, transistors, or the like or a combination thereof. Accordingly, separate processes used for forming additional photoresist patterns may not be needed as discussed with reference to FIG. 3B.

Referring to FIG. 4C, adjacently disposed chips 100 may be separated from each other by, for example, performing a dicing operation along the scribe line SL using, for example, a laser or a conventional diamond-tipped cutter or diamond saw. Upon separating the chips 100, portions of each conductive pattern 108 overlying regions of the semiconductor substrate 102 occupied by the scribe line SL are removed. Portions of each conductive pattern 108 remaining within the chip 100 after the dicing define a portion of the side pad 120. Accordingly, a portion of the lower conductive pattern 108b remaining within the chip 100 after the dicing forms the lower conductive pattern 120b that defines a portion of the side pad 120 as shown in, for example, FIGS. 2A and 2B. Similarly, a portion of the upper conductive pattern 108a remaining within the chip 100 after the dicing forms the upper conductive pattern 120a of the side pad 120. Thereafter, optionally, the side surface of the chip through which the side pads 120 are exposed can be polished or smoothened out for better connectivity with the conductive interconnects 312.

In summary, the chip 100 may be formed by providing a semiconductor substrate 102 having a plurality of chip areas spaced apart by a dicing area, forming a lower conductive pattern 108b over the semiconductor substrate 102 and within at least one chip area, forming an interlayer dielectric layer 110 over the lower conductive pattern 108b and the dicing area, forming an upper conductive pattern 108a over the interlayer dielectric layer 110 and the at least one chip area such that at least one of the lower and upper conductive patterns 108b and 108a extends into the dicing area, and separating the chip areas at the dicing area. Thus, when the chips 100 are singulated by dicing the semiconductor substrate 102 at the scribe line SL, end portions of the lower conductive patterns 108 exposed through the interlayer dielectric layer 110 on the resulting side surfaces define the side pads 120.

A passivation layer (not shown) may be formed on the semiconductor substrate 102 prior to separating the chips 100. In such an embodiment, the passivation layer may be formed over the third interlayer dielectric layer 112 and the chip pads 130 and openings may be formed (e.g., by conventional photo lithography processes) within the passivation layer to expose the chip pads 130.

Figure 5A:
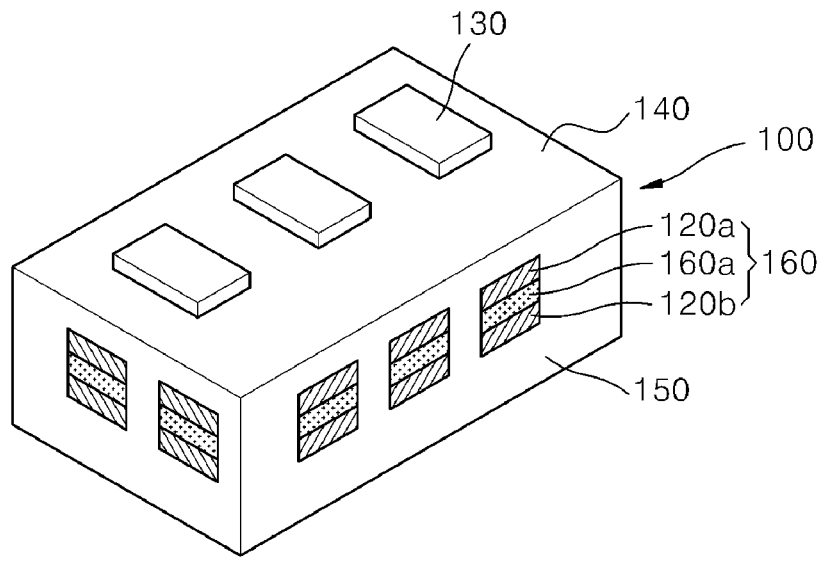
FIGS. 5A and 5B are perspective views of a chip having side pads according to other embodiments.
Figure 5B:
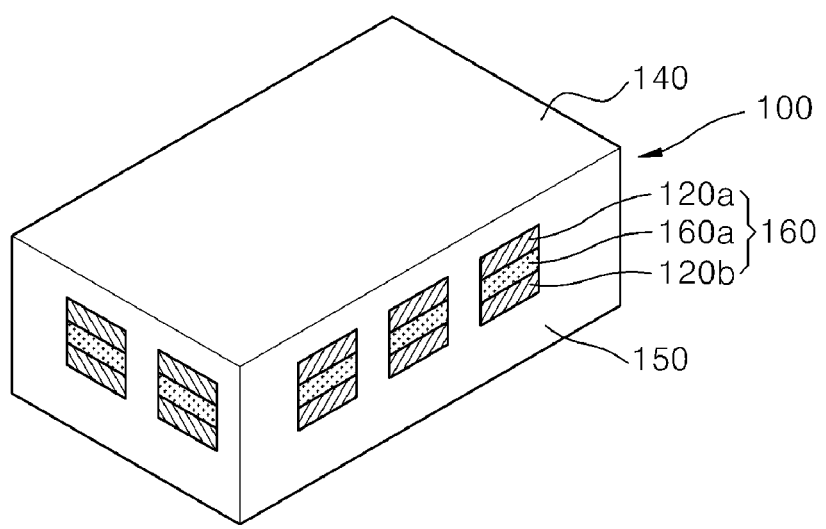

FIGS. 5A and 5B are perspective views of a chip having side pads according to other embodiments.

Referring to FIG. 5A, a chip 100 according to another embodiment may be similar to the chip 100 exemplarily described with respect to FIG. 2A. Side pads 160 of the chip 100 shown in FIG. 5A are similar to the side pads 120 shown in FIG. 2A but may further include an intermediate conductive pattern 160a between the upper conductive pattern 120a and the lower conductive pattern 120b.

In one embodiment, the intermediate conductive pattern 160a may electrically connect the upper conductive pattern 120a and the lower conductive pattern 120b. At least a portion of the intermediate conducive pattern 160a may be exposed on the side surface 150 of the chip 100. In one embodiment, the intermediate conductive pattern 160a may be a "bar-type conductive pattern" and have a width that is substantially equal to a width of the upper conductive pattern 120a and/or the lower conductive pattern 120b. According to one aspect, in the case of the bar-type conductive pattern, when viewed in a cross section, the ratio of a width to a length may be about 1:2. By providing a bar-type intermediate conductive pattern 160a, the contact area of the side pad 160 may be increased to ensure improved solderability and reduced contact resistance. In another embodiment, however, the intermediate conductive pattern 160a may be a "contact-type conductive pattern" and have a width that is less than a width of the upper conductive pattern 120a and/or the lower conductive pattern 120b. The contact-type pattern may have a shape of a typical via pattern that connects metallization at different levels.

In another embodiment, the intermediate conducive pattern 160a may be concealed from the side surface 150 of the chip 100. Accordingly, exposed portions of the upper conductive pattern 120a and lower conductive pattern 120b may be electrically coupled to each other inside of the chip 100, not necessarily at the side surface 150 thereof. It will be appreciated, however, that the chip 100 need not include chip pads 130. Such an alternative embodiment is exemplarily shown in FIG. 5B.

According to one aspect, the number of the conductive patterns 120a, 120b and the number of intermediate conductive patterns 160a may be varied. For example, if the number of the conductive patterns are more than two, the number of the intermediate conductive pattern may be varied. In particular, if the chip is a logic large-scale-integration (LSI) chip, there may be a total of seven conductive patterns. In this case, six intermediate conductive patterns may be included within a side pad. However, the intermediate conductive patterns may not need to be formed between each conductive pattern of the side pad 160.

Figure 6A:
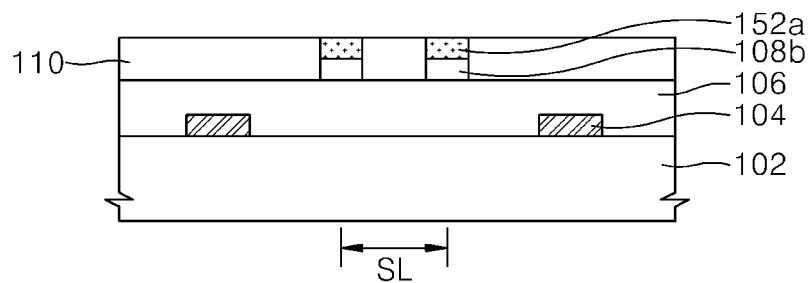
FIGS. 6A-6C are cross-sectional views illustrating an exemplary method of forming the chip shown in FIG. 5A.
Figure 6B:
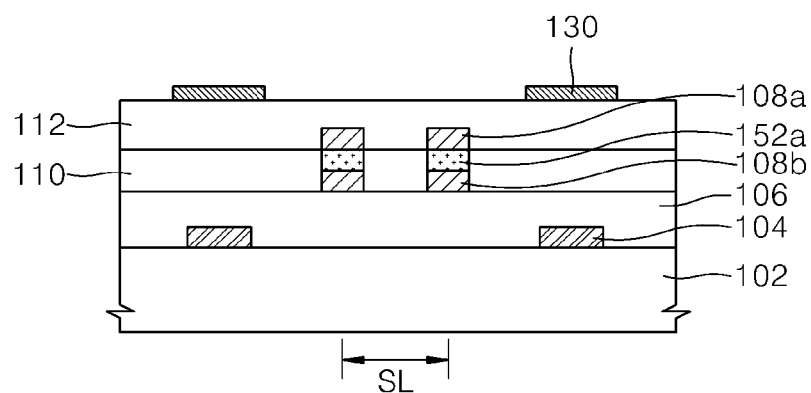
Figure 6C:
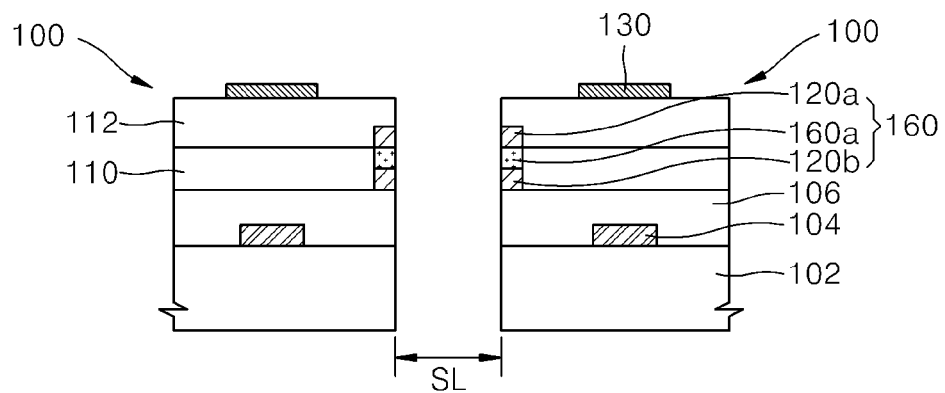

FIGS. 6A-6C are cross-sectional views illustrating an exemplary method of forming the chip exemplarily shown in FIG. 5A.

Referring to FIG. 6A, a chip 100 may be formed according to a process that includes, for example, forming a conductive structure 104 on the semiconductor substrate 102. In one embodiment, the conductive structure 104 may be substantially the same or similar to the conductive structure 104 described above with respect to FIG. 4A. Next, the first interlayer dielectric layer 106 may be formed over the resultant structure including the semiconductor substrate 102 and the conductive structure 104. Next, a conductive pattern, e.g., a lower conductive pattern 108b may be formed on the first interlayer dielectric layer 106 and the second interlayer dielectric layer 110 may be formed on the lower conductive pattern 108b in a manner that is substantially the same or similar to the manner described above with respect to FIG. 4B. An opening may then be defined within the second interlayer dielectric layer 110 to expose at least a portion of the lower conductive pattern 108b. In one embodiment, the opening may be less than the width of the lower conductive pattern 108b, thereby facilitating the subsequent forming of a contact-type conductive pattern. In another embodiment, the opening may be substantially equal to the width of the lower conductive pattern 108b, thereby facilitating the subsequent forming of a bar-type conductive pattern. In one embodiment, a portion of the second interlayer dielectric layer 110 is removed using conventional photolithographic techniques to define the opening. An intermediate conductive pattern 152a may be formed within the opening.

Referring to FIG. 6B, another conductive pattern, e.g., an upper conductive pattern 108a may then be formed on the second interlayer dielectric layer 110 and on the intermediate conductive pattern 152a, followed by forming the third interlayer dielectric layer 112 on the upper conductive pattern 108a. The width of the intermediate conductive pattern 152a and the width of the upper conductive pattern 108a may be substantially the same. However, it is not necessary.

The intermediate conductive pattern 152a may be formed while other device structures are formed. For example, the intermediate conductive pattern 152a may be formed while a via pattern is formed during the conventional semiconductor fabrication. Thus, additional mask to form the intermediate conductive pattern 152a may not be needed as the patterns for forming the intermediate conductive pattern 152a may just be added to the photomask to form the via pattern. Thus, additional photolithographic process to form the intermediate conductive pattern 152a may not be needed.

In one embodiment, the second interlayer dielectric layer 110 and the third interlayer dielectric layer 112 may be formed in a manner substantially the same or similar to the manner in which the first interlayer dielectric layer 106 was formed. In one embodiment, the upper conductive pattern 108a and the lower conductive pattern 108b may be formed in a manner substantially the same or similar to the manner described above with respect to FIG. 4B.

In one embodiment, the intermediate conductive pattern 152a may be formed by depositing a conductive material within the opening defined in the second interlayer insulating layer 110 and selectively removing portions of the conductive material outside the opening. Thus, depending on the width of the opening defined in the second interlayer insulating layer 110, the intermediate conductive pattern 152a may be provided as a conductive via pattern or conductive contact as discussed above.

After forming the third interlayer dielectric layer 112 over the conductive pattern 108a, the chip pads 130 may be formed on the third interlayer dielectric layer 112. In one embodiment, the chip pads 130 may be substantially the same or similar to the chip pads 130 described above with respect to FIG. 4B.

Referring to FIG. 6C, the chips 100 may then be separated from each other in a manner substantially the same as or similar to the manner as described above with respect to FIG. 4C. Accordingly, upon separating the chips 100, portions of the intermediate conductive pattern 152a overlying regions of the semiconductor substrate 102 occupied by a scribe line SL are removed. Portions of each intermediate conductive pattern 152a remaining within the chip 100 after the dicing operation form the intermediate conductive pattern 160a that forms the side pad 160. Thus, according to the method exemplarily described above, the lower conductive pattern 120b and the upper conductive pattern 120a are electrically connected with an intermediate conductive pattern 160a to form the side pad 160. In one embodiment, at least a portion of the intermediate conductive pattern 160 may be exposed on the side surface 150 of the chip 100.

A passivation layer (not shown) may be formed on the semiconductor substrate 102 in a manner substantially the same as or similar to the manner as described above with respect to FIG. 4C.

Figure 7:
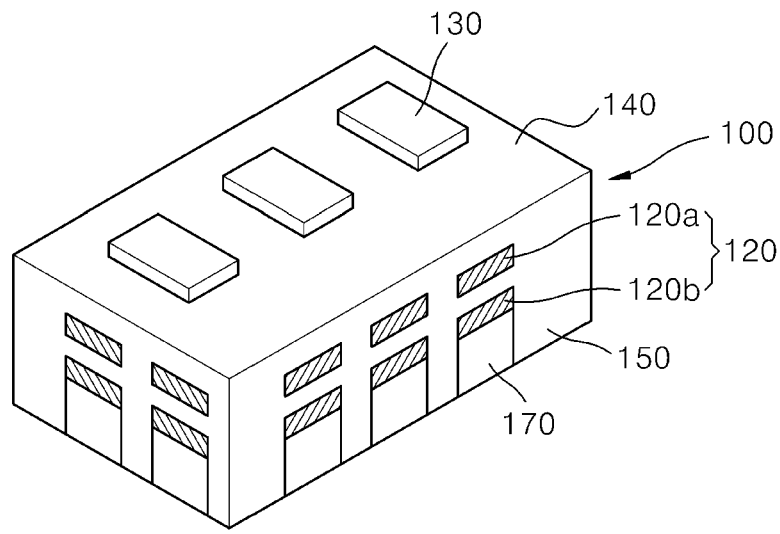
FIG. 7 is a perspective view of a chip having side pads according to yet another embodiment.

FIG. 7 is a perspective view of a chip having side pads according to yet another embodiment.

Referring to FIG. 7, a chip 100 according to yet another embodiment may be similar to the chip 100 exemplarily described with respect to FIG. 2A but may further include a conductive member 170 exposed on a side surface 150 of the chip 100 below the lower conductive pattern 120b. It will be appreciated, however, that the chip 100 need not include chip pads 130. In one embodiment, the conductive member 170 may include a metal such as Al, Cu, W, Mo, or the like or a combination thereof and/or a conductive metal nitride such as TiN, TaN, WN, or the like or a combination thereof.

As illustrated, the conductive member 170 may be connected to the lower conductive pattern 120b, for example, at the side surface 150 of the chip 100. In another embodiment, however, the conductive member 170 may be disconnected to the lower conductive pattern 120b at the side surface 150 of the chip 100 and electrically connected to the lower conductive pattern 120b at other places, e.g., inside of the chip 100. Also, the conductive member 170 may be in contact with the semiconductor substrate 102. Alternatively, the conductive member 170 may be spaced apart or disconnected from the semiconductor substrate 102.

In one embodiment, the conductive member 170 may be a "bar-type conductive member" and have a width that is substantially equal to a width of the lower conductive pattern 120b. By providing a bar-type conductive member 170, the contact area of the side pad 120 may be increased to ensure improved solderability and reduced contact resistance. In another embodiment, the conductive member 170 may be a "contact-type conductive member" and have a width that is less than a width of the lower conductive pattern 120b.

Figure 8A:
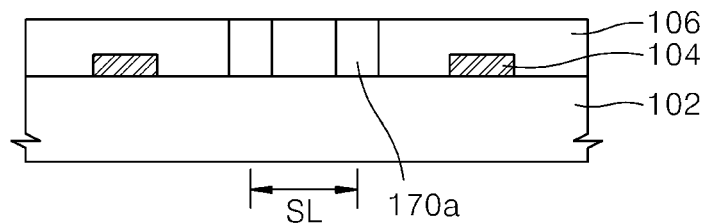
FIGS. 8A-8C are cross-sectional views illustrating an exemplary method of forming the chip shown in FIG. 7.
Figure 8B:
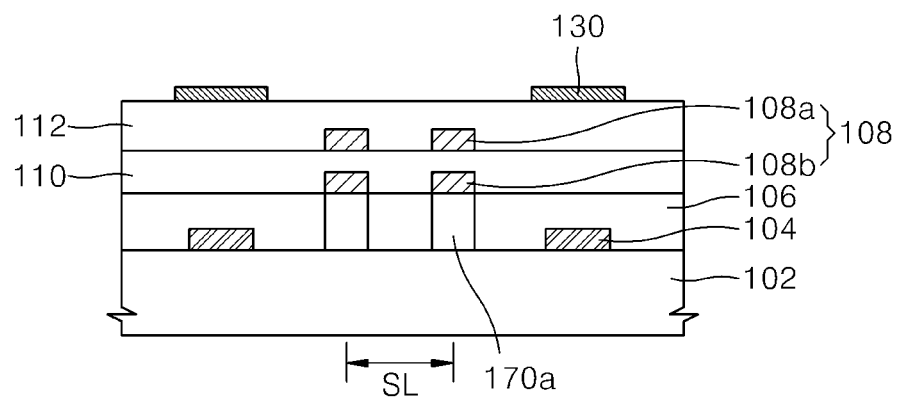
Figure 8C:
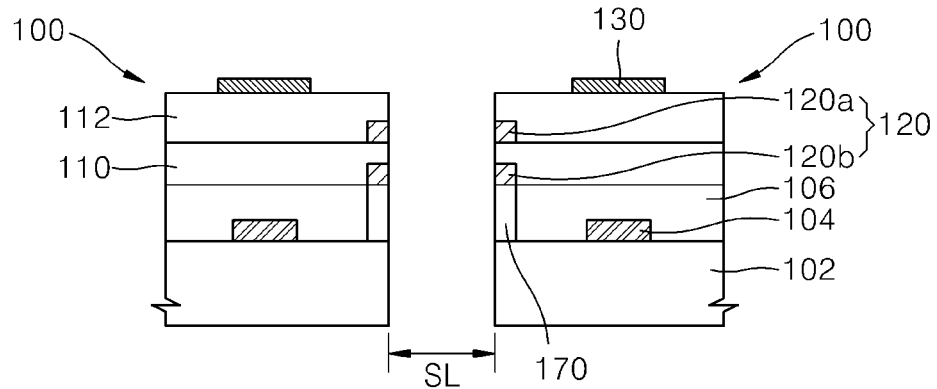

FIGS. 8A-8C are cross-sectional views illustrating an exemplary method of forming the chip shown in FIG. 7.

Referring to FIG. 8A, a conductive structure 104 is formed on a semiconductor substrate 102 to form a chip 100. In one embodiment, the conductive structure 104 may be substantially the same or similar to the conductive structure 104 described above with respect to FIG. 4A. Next, a first interlayer dielectric layer 106 may be formed over the resultant structure including the semiconductor substrate 102 and the conductive structure 104. In one embodiment, the conductive structure 104 may be substantially the same or similar to the conductive structure 104 described above with respect to FIG. 4A. The conductive member 170a may be formed using conventional techniques such as thin film deposition and planarization such as CMP. As discussed above, the conductive member 170a may be or may not be in contact with the semiconductor substrate 102.

The remainder of the processes for forming the chip 100 as shown in FIGS. 8B and 8C may be substantially the same or similar to the manner as described above with respect to FIGS. 4B and 4C. For example, as shown in FIG. 8C, adjacently disposed chips 100 may be separated from each other by, for example, performing a dicing operation along the scribe line SL using a laser or a conventional diamond-tipped cutter or diamond saw. Upon separating the chips 100, portions of each conductive pattern 108 overlying regions of the semiconductor substrate 102 occupied by a scribe line SL are removed. Portions of each conductive pattern 108 remaining within the chip 100 after the dicing form the side pad 120. Accordingly, a portion of the lower conductive pattern 108b remaining within the chip 100 after the dicing forms the lower conductive pattern 120b of the side pad 120. Similarly, a portion of the upper conductive pattern 108a remaining within the chip 100 after the dicing forms the upper conductive pattern 120a of the side pad 120. During this process, the conductive member 170 may also be exposed through the first interlayer dielectric layer 106.

Thus, in summary, the chip 100 may be formed by forming the conductive member 170 located below the lower conductive pattern 120b. At least a portion of the conductive member 170 may be exposed on the side surface 150 of the chip 100 and is electrically connected to the lower conductive pattern 120b. In other words, the lower conductive pattern 108b is formed over the conductive member 170 and the conductive member 170 may be in contact with the lower conductive pattern 108b.

Figure 9:
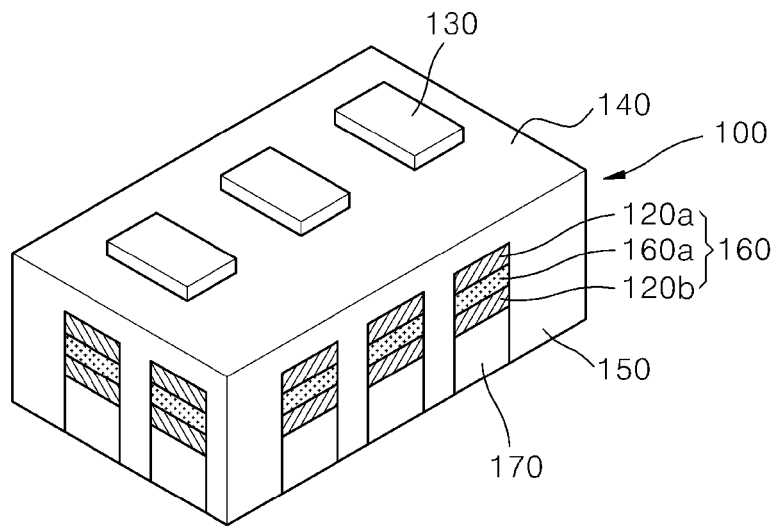
FIG. 9 is a perspective view of a chip having side pads according to still another embodiment.

FIG. 9 is a perspective view of a chip having side pads according to still another embodiment. Referring to FIG. 9, a chip 100 according to still another embodiment may be similar to the chip 100 exemplarily described with respect to FIG. 5A, except that the conductive member 170 may be exposed on a side surface 150 of the chip 100 below the lower conductive pattern 120b as previously discussed above with respect to FIG. 7. It will be appreciated, however, that the chip 100 need not include chip pads 130.

As illustrated, the conductive member 170 is electrically connected to the lower conductive pattern 120b at the side surface 150 of the chip 100. In another embodiment, however, the conductive member 170 may be electrically disconnected to the lower conductive pattern 120b at the side surface 150 of the chip 100 and connected elsewhere such as inside of the chip 100. In one embodiment, the conductive member 170 may be a "bar-type conductive member" and have a width that is substantially equal to a width of the lower conductive pattern 120b. By providing a bar-type conductive member 170, the contact area of the side pad 160 may be increased to ensure improved solderability and reduced contact resistance. In another embodiment, the conductive member 170 may be a "contact-type conductive member" and have a width that is less than a width of the lower conductive pattern 120b.

Figure 10A:
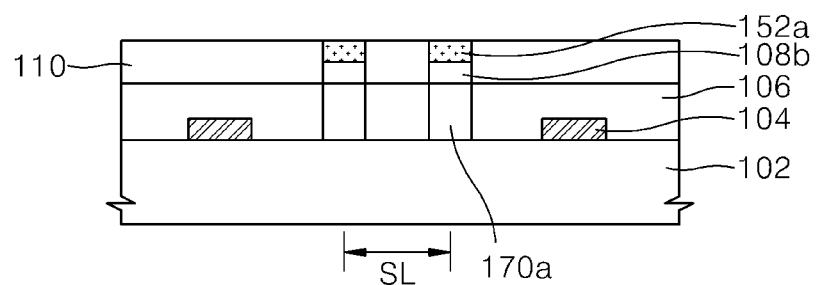
FIGS. 10A to 10C are cross-sectional views illustrating an exemplary method of forming the chip shown in FIG. 9.
Figure 10B:
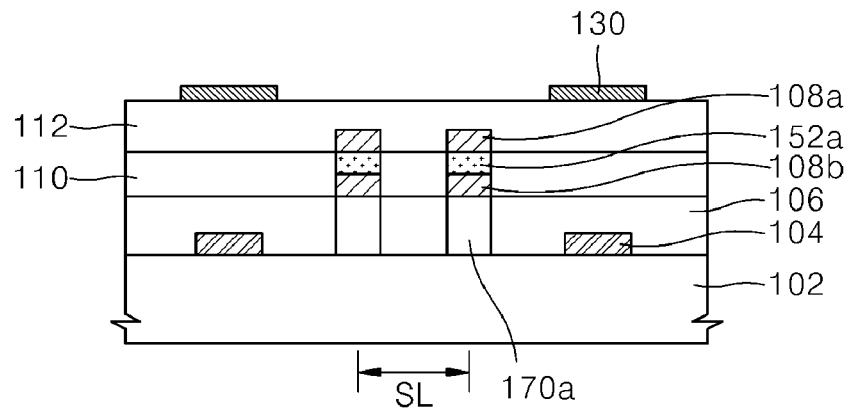
Figure 10C:
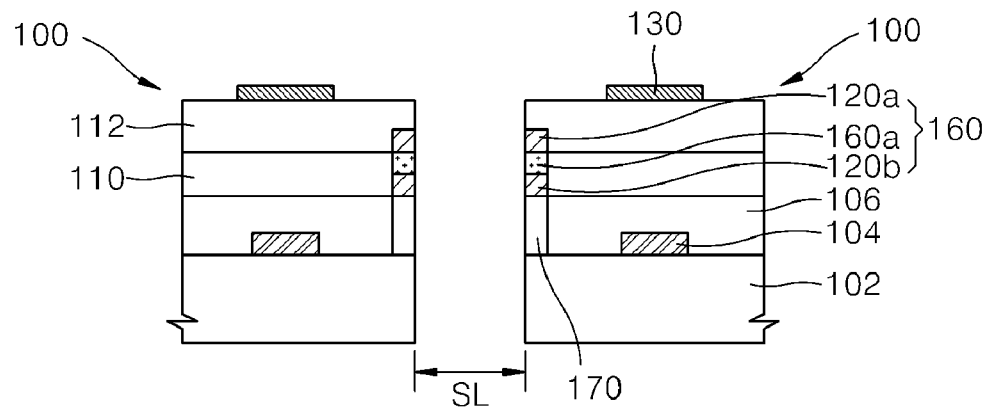

FIGS. 10A to 10C are cross-sectional views illustrating an exemplary method of forming the chip shown in FIG. 9.

Referring to FIG. 10A, a chip 100 may be formed according to a process that is substantially the same or similar to the process described above with respect to FIG. 6A, except that the conductive member 170a is further formed according to a process that is substantially the same or similar to the process described above with respect to FIG. 8A. The remainder of the process for forming the chip 100 as shown in FIGS. 10B and 10C may be substantially the same or similar to the manner as described above with respect to FIGS. 6B and 6C.

Figure 11:
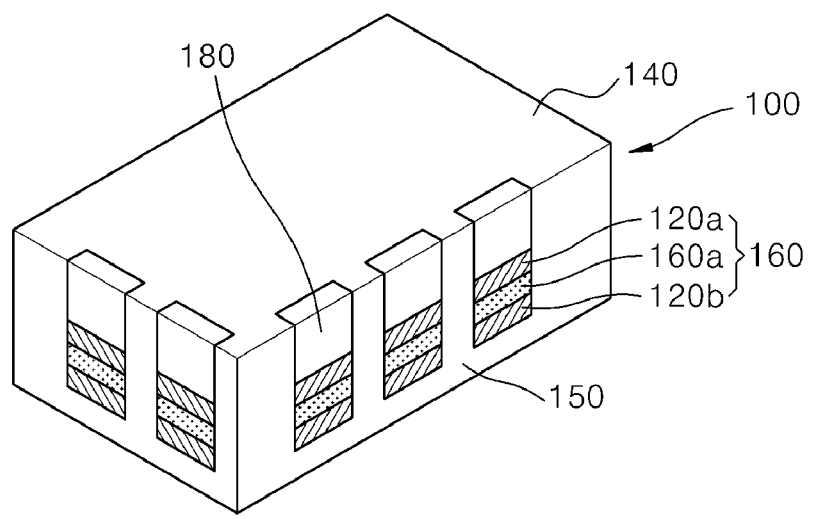
FIG. 11 is a perspective view illustrating an exemplary method of forming a chip having side pads according to another embodiment.

FIG. 11 is a perspective view illustrating an exemplary method of forming a chip having side pads according to another embodiment.

Referring to FIG. 11, a chip 100 according to another embodiment may be similar to the chip 100 exemplarily described with respect to FIG. 9, except that a conductive member 180 may be exposed on a side surface 150 of the chip 100 above the upper conductive pattern 120a.

As illustrated, the conductive member 180 may be connected to the upper conductive pattern 120a at the side surface 150 of the chip 100. Thus, the chip 100 may be formed by forming a conductive member 180 located above the upper conductive pattern 120a. At least a portion of the conductive member 180 is exposed on the side surface 150 of the chip 100 and is electrically connected to the upper conductive pattern 120a. In another embodiment, although not shown, the conductive member 180 may be disconnected to the upper conductive pattern 120a at the side surface 150 of the chip 100 and connected elsewhere such as inside of the chip 100.

In one embodiment, the conductive member 180 may be a "bar-type conductive member" and have a width that is substantially equal to a width of the upper conductive pattern 120a. By providing a bar-type conductive member 180, the contact area of the side pad 160 may be increased to ensure improved solderability and reduced contact resistance. In another embodiment, the conductive member 180 may be a "contact-type conductive member" and have a width that is less than a width of the upper conductive pattern 120a. It will be appreciated, however, that the chip 100 may include chip pads 130 as shown in FIG. 5A.

Figure 12A:
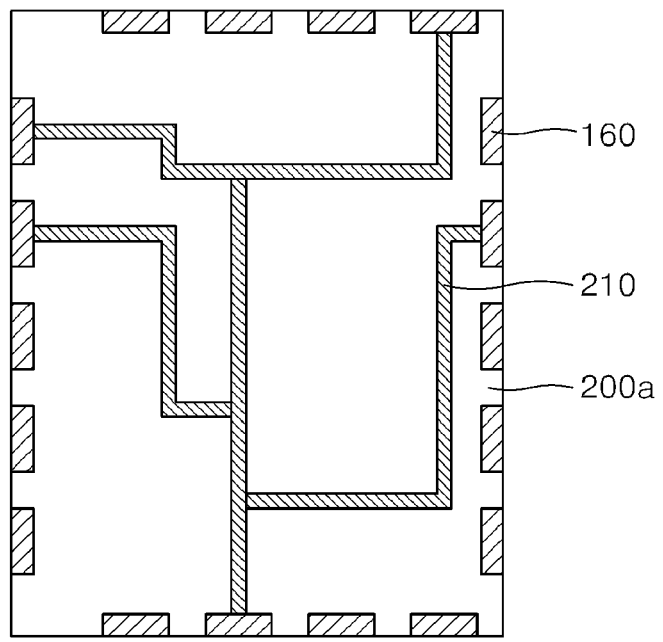
FIGS. 12A-12C are plan views of electrical connections and side pads according to some embodiments.
Figure 12B:
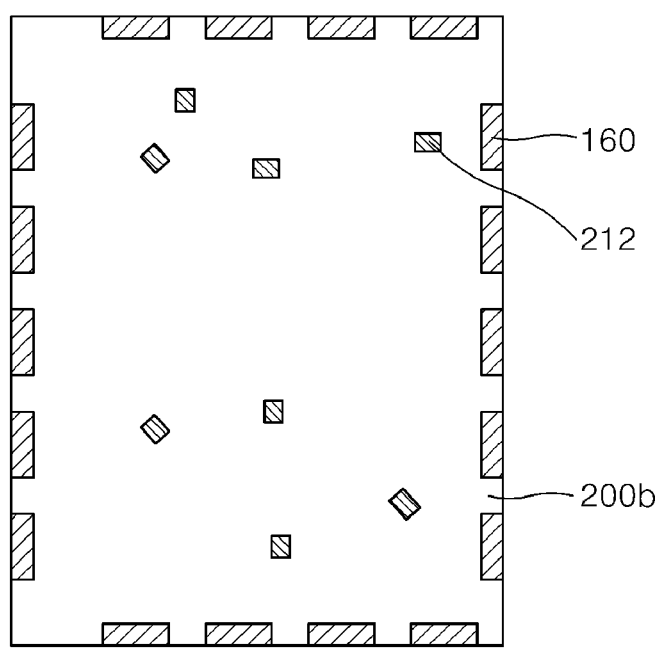
Figure 12C:
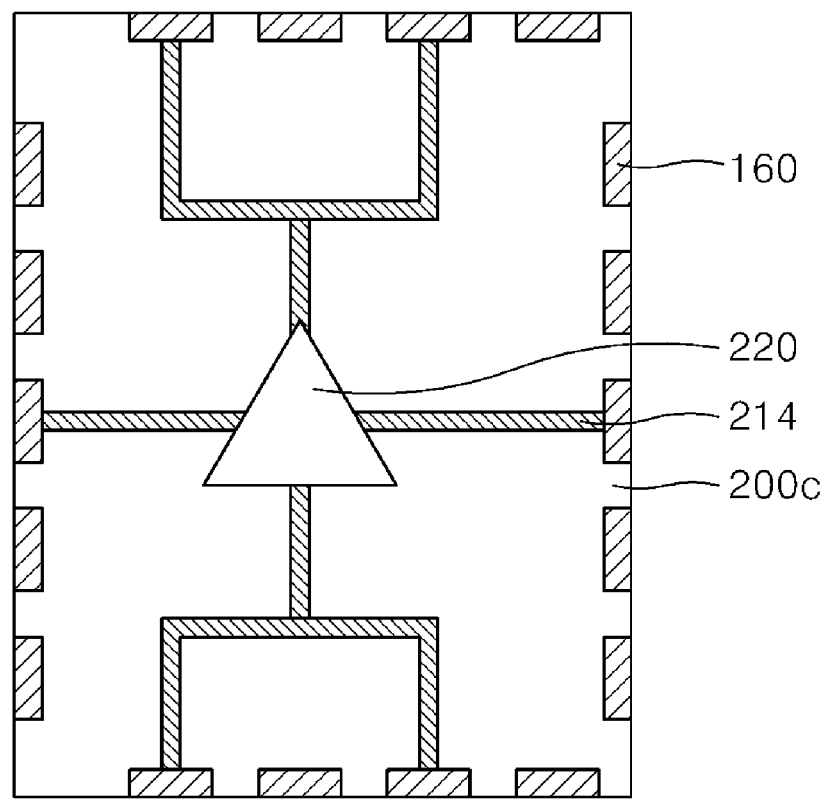

FIGS. 12A-12C are plan views of electrical connections and side pads according to some embodiments to explain relationships or connections between device structures such as a via pattern and interconnections, and side pads.

Referring to FIG. 12A, additional conductive wiring patterns or interconnections 210 extending substantially horizontally along a plane substantially parallel to the surface of the semiconductor substrate 102 shown, for example, in FIG. 3B may be formed with side pads 160 discussed above. That is, the conductive wiring patterns 210 may be formed in the same process(es) used to form conductive patterns that form the side pads 160. In other words, the conductive wiring patterns 210 and the upper conductive pattern 120a, shown in, for example, FIG. 3B may be formed in an interlayer dielectric layer 200a during the same process. As a result, each side pad 160 can be electrically connected to the conductive wire pattern 210, if needed. This allows the number of interconnection levels (and the complexity of their configuration) to be reduced compared to the conventional semiconductor device, in which the signal path typically extends from the top of the chip 100 (e.g., from the chip pads 40 shown in FIG. 1) to the conductive structure such as transistors. If the chip structure is very complicated with multiple level interconnections, the signal delay and the complexity of the manufacturing processes can be a serious concern. As discussed above, by reducing the number of interconnection levels within the chip 100, the length of signal paths within the chip 100 can be reduced and, therefore, problems associated with signal delays and line resistances along the long signal path can be reduced.

Referring to FIG. 12B, conductive via patterns 212 and an intermediate conductive pattern 160a (see, for example, FIG. 5A) of side pads 160 may be formed in the same process in an interlayer dielectric layer 200b. That is, the conductive via patterns 212 may be formed in the same process(es) used to form the intermediate conductive pattern 160a of the side pads 160. In one embodiment, a conductive via pattern 212 may be formed so as to electrically connect at least two conductive patterns that are vertically located with respect to each other. In another embodiment, the conductive via patterns 212 may be provided as bar-type via patterns (i.e., a via pattern having a width that is substantially the same as a width of an overlying and/or underlying conductive pattern) or contact-type via patterns (i.e., a via pattern having a width that is less than a width of an overlying and/or underlying conductive pattern).

Referring to FIG. 12C, an additional conductive wiring pattern 214 and a lower conductive pattern 120b, shown in, for example, FIG. 3, may be formed in another dielectric layer 200c. These layers may be formed during the same process. In one embodiment, one or more electrical components 220 may be electrically connected to a side pad 160. As a result, it is possible to reduce the number of interconnection levels and, thereby, reduce the complexity of the interconnection process as discussed above.

Figure 13A:
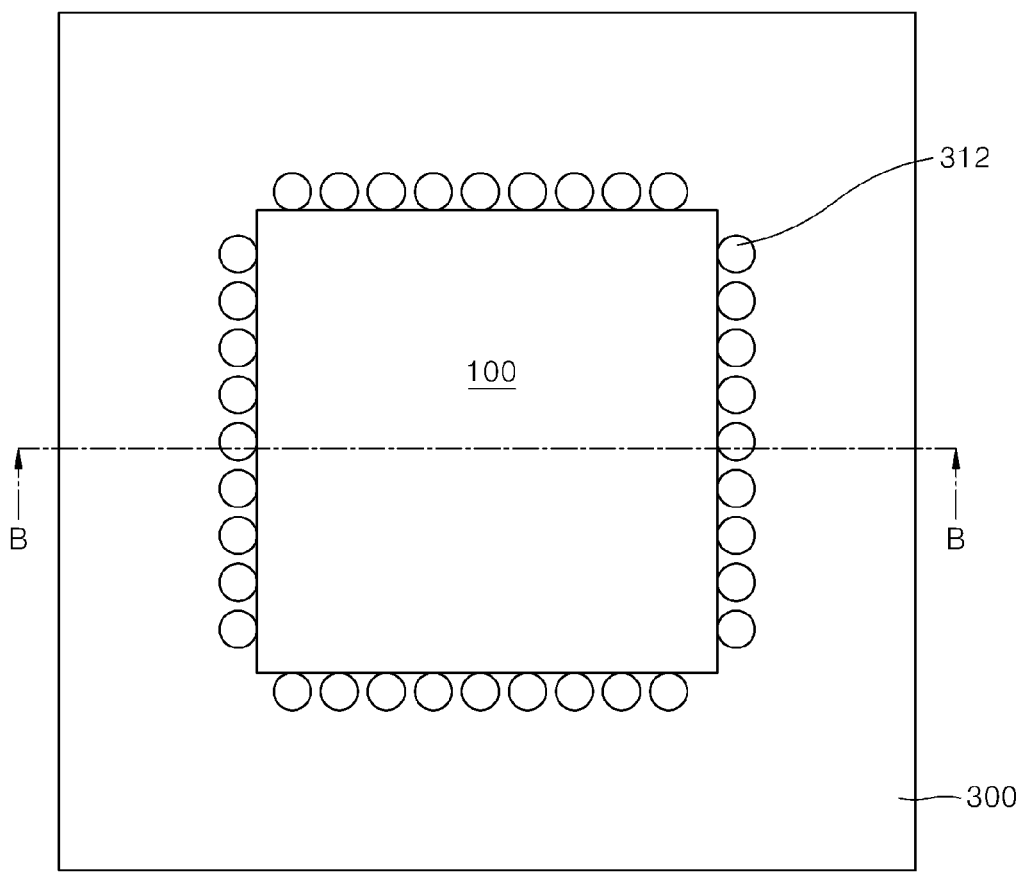
FIG. 13A is a plan view of a package incorporating chip according to one embodiment.
Figure 13B:
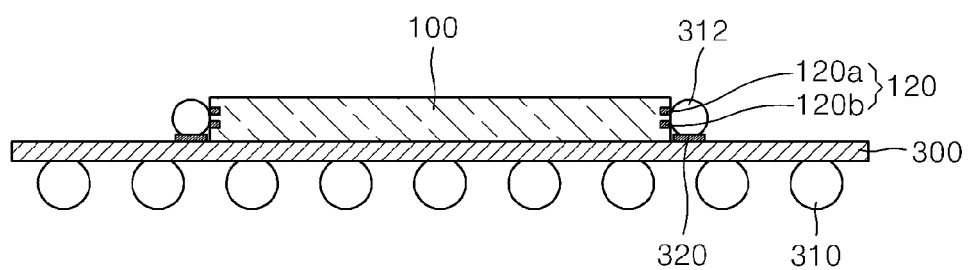
FIGS. 13B and 13C are different exemplary embodiments of cross-sectional views taken along line "B" shown in FIG. 13A.
Figure 13C:
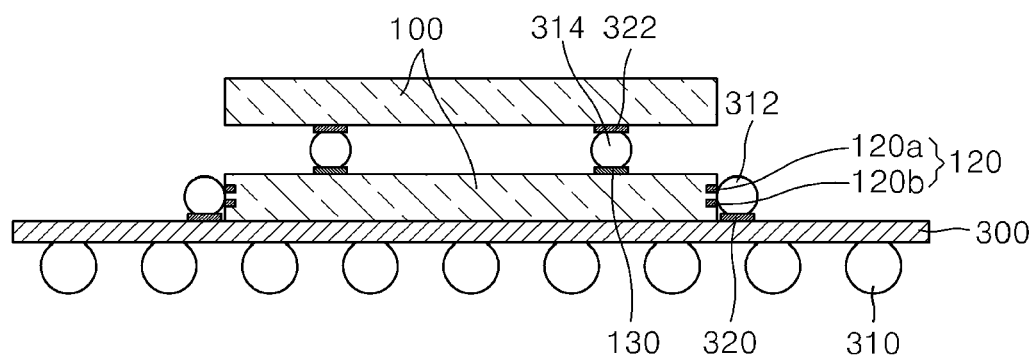

FIG. 13A is a plan view of a package incorporating a chip according to one embodiment. FIGS. 13B and 13C are different exemplary embodiments of cross-sectional views taken along line "B" shown in FIG. 13A.

Referring to FIGS. 13A-13C, a package may, for example, include a first chip 100, a circuit substrate 300 (e.g., a PCB), a plurality of external contact terminals 310 (e.g., solder balls), a plurality of conductive interconnects 312 and a plurality of first circuit substrate pads 320. In one embodiment, the circuit substrate 300 may be a multi-layer PCB or film package substrate which has a circuit pattern on an organic material substrate. The circuit substrate 300 may be used for various applications such as memory circuits, display, or LDI device. The circuit substrate 300 may include the plurality of first circuit substrate pads 320. Accordingly, the conductive interconnects 312 may electrically connect side pads 120 to corresponding ones of the first circuit substrate pads 320 on the circuit substrate 300. Thus, a package may be formed by, for example, providing a circuit substrate 300 having a plurality of first circuit substrate pads 320 and connecting the first circuit substrate pads 320 to the side pads 120, i.e., the lower and upper conductive patterns 120b and 120a exposed on the side surface 150 of the first chip 100 with the conductive interconnects 312.

In one embodiment, the conductive interconnects 312 may comprise conductive balls, conductive bumps, solder balls, solder bumps, solder paste, anisotropic conductive film, a metal layer, or the like or a combination thereof. The first chip 100 may be provided as described above with respect to FIG. 2A, 2B, 5A, 5B, 7, 9 or 11. For example, as shown in FIG. 13B, the first chip 100 may be provided as described above with respect to FIG. 2B or, as shown in FIG. 13C, the first chip 100 may be provided as described above with respect to FIG. 7, but without the chip pads 130.

As exemplarily shown in FIGS. 13B and 13C, the conductive interconnect 312 may electrically and mechanically connect the side pad 120 of the first chip 100 with the first circuit substrate pad 320 formed on the circuit substrate 300. In one embodiment, the conductive interconnects 312 may contact at least a portion of the conductive member 170. By electrically connecting the first chip 100 and the circuit substrate 300 via the side pads 120, electrical interconnections such as wires that extend over the top surface of the chip 100, or solder balls which are interposed between the chip 100 and the circuit substrate 300, are not required. Accordingly, the thickness of the package can be maintained to be substantially small, e.g., substantially equal to the combined thickness of the chip 100 and the circuit substrate 300. Thus, the size of the package can be made small.

According to one aspect, the first chip 100 shown in FIGS. 13A-13C can be directly attached to a circuit substrate 300, e.g., PCB depending on the applications. If the first chip 100 is directly attached to the circuit substrate 300, no layers (e.g., adhesive layers) need to be present between the circuit substrate 300 and the first chip 100. In other words, first chip 100 is placed on the circuit substrate 300 without any physical or mechanical connection therebetween. As a result, the thickness of package incorporating the first chip 100 can be further reduced as additional layers such as an adhesive layer need not be formed. However, additional layer such as an adhesive layer can be placed between the chip 100 and the circuit substrate 300 to provide additional adhesion force therebetween.

In another aspect, solder balls 310 shown in FIGS. 13B and 13C are not necessary and other known forms of electrical connection between the packages and the PCB can be utilized.

FIGS. 14A and 14B, 15A and 15B, and 16A and 16B are cross-sectional views of other exemplary embodiments of packages, taken along line "B" shown in FIG. 13A.

The conductive interconnect 312 described above with respect to FIGS. 13A-13C may be provided as a substantially spherically-shaped conductive interconnect. However, the conductive interconnects may be provided in substantially any shape as long as they provide adequate electrical connection between the chip 100 and the circuit substrate 300. For example, a first chip 100 may be electrically connected to a circuit substrate 300 via a substantially rectangular conductive interconnect 316 (see FIGS. 14A and 14B), a substantially triangular conductive interconnect 318 (see FIGS. 15A and 15B) or a concavely-bowed triangular conductive interconnect 319 (see FIGS. 16A and 16B), or the like.

Figure 14A:
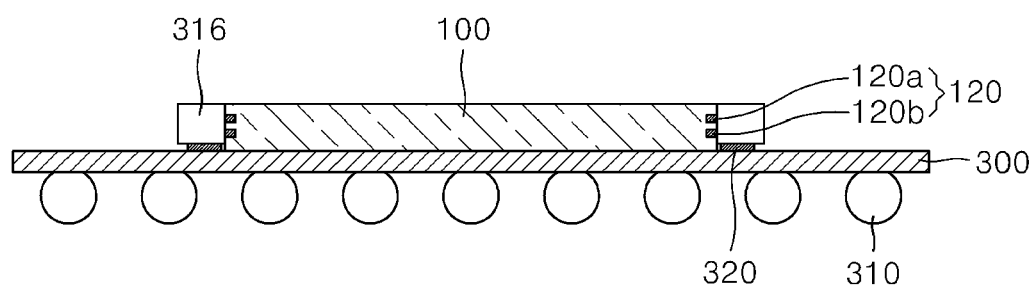
FIGS. 14A and 14B are cross-sectional views of other exemplary embodiments of a package, taken along line "B" shown in FIG. 13A.
Figure 14B:
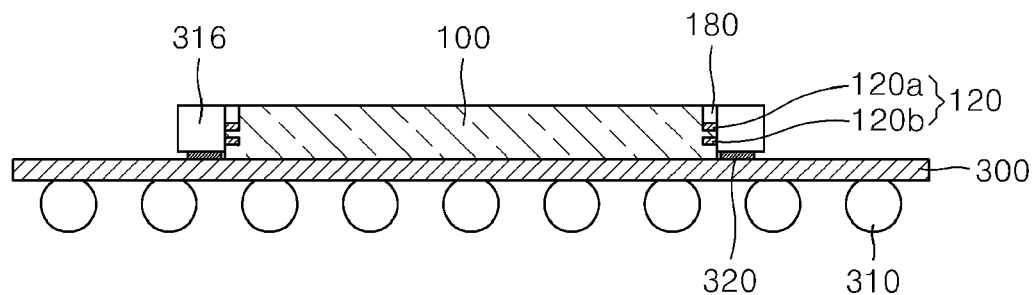
Figure 15A:
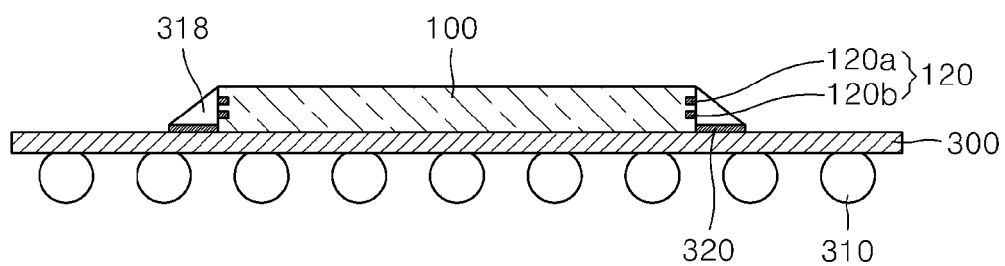
FIGS. 15A and 15B are cross-sectional views of yet other exemplary embodiments of a package, taken along line "B" shown in FIG. 13A.
Figure 15B:
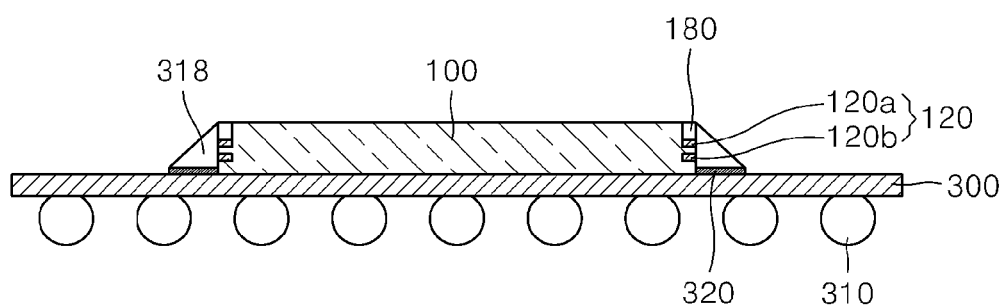
Figure 16A:
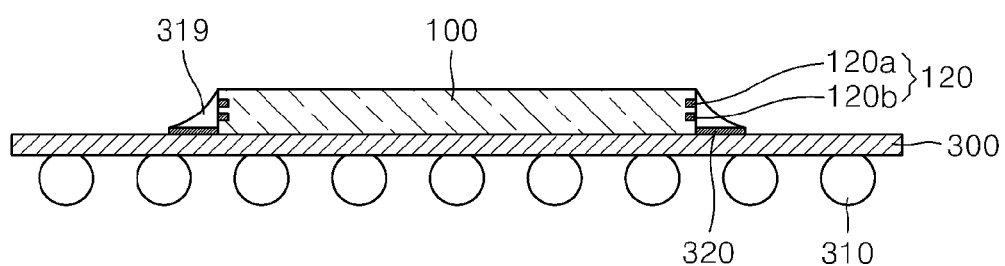
FIGS. 16A and 16B are cross-sectional views of still other exemplary embodiments of a package, taken along line "B" shown in FIG. 13A.
Figure 16B:
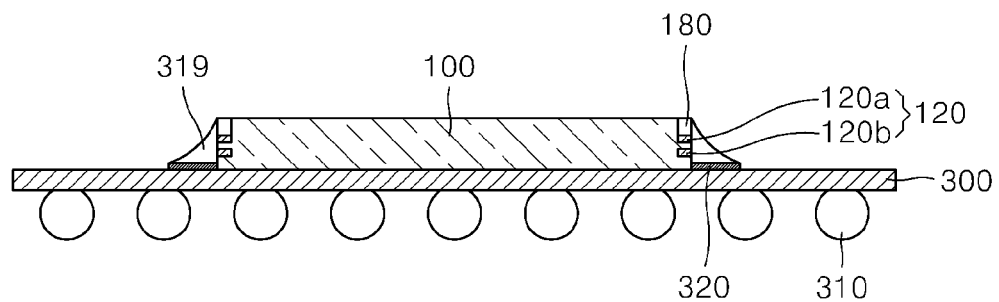

If the conductive interconnect has a rectangular shape or a triangular conductive interconnect, the contact area between the conductive interconnect 312 and the chip 100 can be increased compared to the spherically-shaped interconnect, thereby increasing the adhesion force between the chip 100 and the conductive interconnect 312. The triangular conductive interconnect 318 may be formed by reflowing the conductive interconnect 312 having other shapes such as a rectangular shape. As shown in FIGS. 14B, 15B and 16B, the conductive interconnects 316, 318 and 319 contact at least a portion of the conductive member 180.

FIGS. 17A-17D are cross-sectional views of exemplary embodiments of a package incorporating a plurality of chips.

Figure 17A:
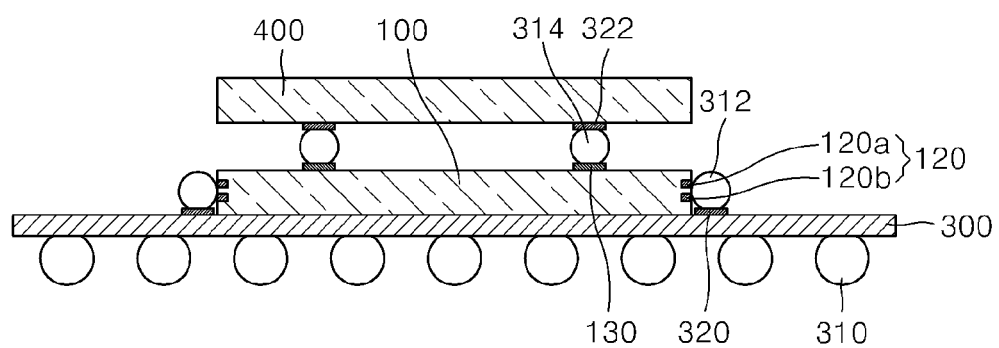
FIGS. 17A-17D are cross-sectional views of exemplary embodiments of a package incorporating a plurality of chips.

Referring to FIG. 17A, a package may, for example, be provided as a package similar to that described above with respect to FIG. 13B. In the illustrated embodiment, however, the first chip 100 may be provided with chip pads 130. Thus, the first chip 100 may be provided as exemplarily described above with respect to FIG. 2A and a second chip 400 having chip pads 322 may be bonded to the first chip 100 via an electrical interconnection or external contact terminals 314 (e.g., solder balls, solder paste, anisotropic conductive film, a metal layer, or the like or a combination thereof) disposed between corresponding ones of the chip pads 130 and the chip pads 322. Thus, the package may be formed by providing chip pads 130 on the top surface of the first chip 100, providing a second chip 400 overlying the first chip 100 and connecting the second chip 400 to the chip pads 130 of the first chip 100 with external contact terminals 314.

Figure 17B:
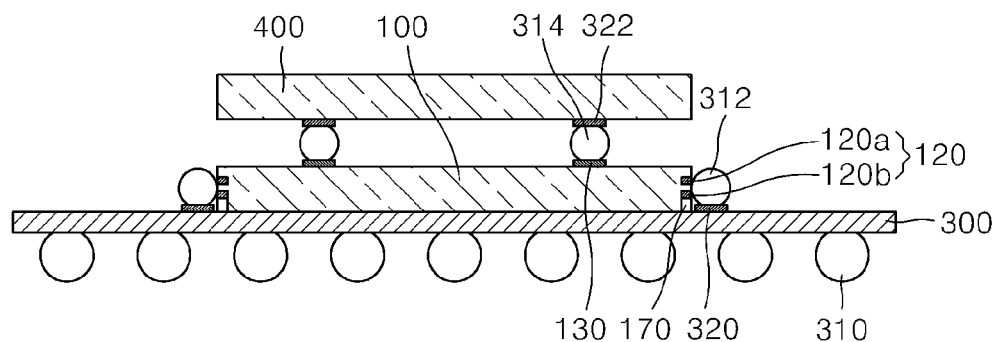

The second chip 400 may be the same or different from the first chip 100. For example, the first chip 100 and the second chip 400 could be variously provided as logic and/or memory chips. FIG. 17B illustrates another embodiment of a package similar to the embodiment shown in FIG. 17A except that the first chip 100 includes conductive members 170 as described above with respect to FIG. 7. It will be appreciated that, although not explicitly shown, the first chip 100 may be also or alternatively be provided as described above with respect to FIG. 5A or 9, among others.

Figure 17C:
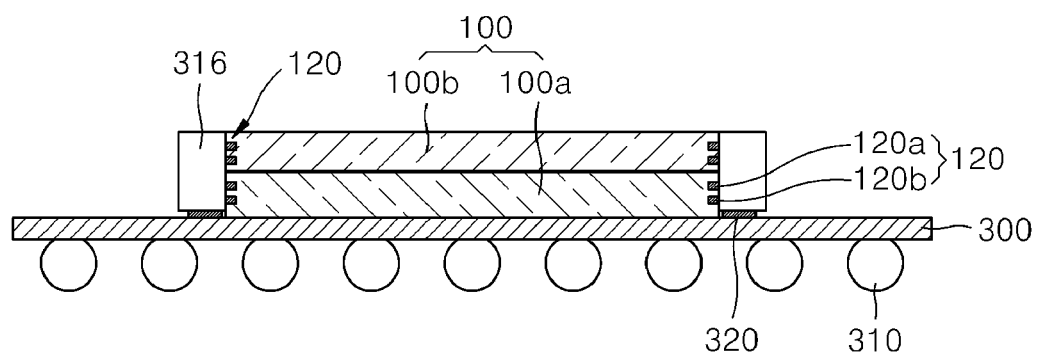

Referring to FIG. 17C, a package may, for example, include a plurality of first chips 100 (e.g., a lower first chip 100*a* and an upper first chip 100*b*) may be provided as exemplarily described above with respect to FIG. 2B. The upper first chip 100*b* is disposed on the lower first chip 100*a*. Thus, a plurality of first chips 100 may be arranged vertically adjacent to each other on the circuit substrate 300. Side pads 120 of the lower first chip 100*a* may be electrically and mechanically connected to side pads 120 of the upper first chip 100*b* via conductive interconnections such as the substantially rectangular conductive interconnects 316 described above with respect to FIG. 14A. Although FIG. 17C illustrates only two first chips 100 stacked upon each other, it will be appreciated that any number of first chips 100 may be stacked upon each other and electrically/mechanically connected via conducive interconnects. Moreover, any type of conductive interconnect may be used to electrically/mechanically connect the stacked first chips 100. Because the conductive interconnect (e.g., substantially rectangular conductive interconnect 316) electrically and mechanically connects the lower first chip 100*a* and the upper first chip 100*b*, no adhesive layer need be inserted therebetween. It will be appreciated, however, that an adhesive layer may be disposed between the lower first chip 100*a* and the upper first chip 100*b* if desired. Further, although FIG. 17C illustrates wherein the first chips 100 are provided as described above with respect to FIG. 2B, it will be appreciated that one or more of the first chips 100 may be provided as exemplarily described above with respect to any of FIG. 2A, 2B, 5A, 5B, 7, 9 or 11.

Figure 17D:
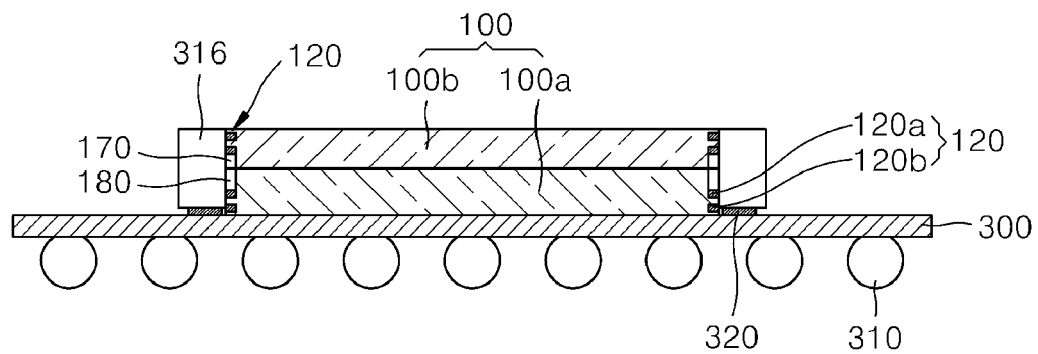

Referring to FIG. 17D, a package may, for example, be provided as a package similar to that described above with respect to FIG. 17C except that the lower first chip 100*a* may be provided as exemplarily described above with respect to FIG. 11 and the upper first chip 100*b* may be provided as exemplarily described above with respect to FIG. 7. Accordingly, the conductive member 180 of the lower first chip 100 may directly contact with the conductive member 170 of the upper first chip 100 to further increase the contact area between the first chips 100.

Figure 18A:
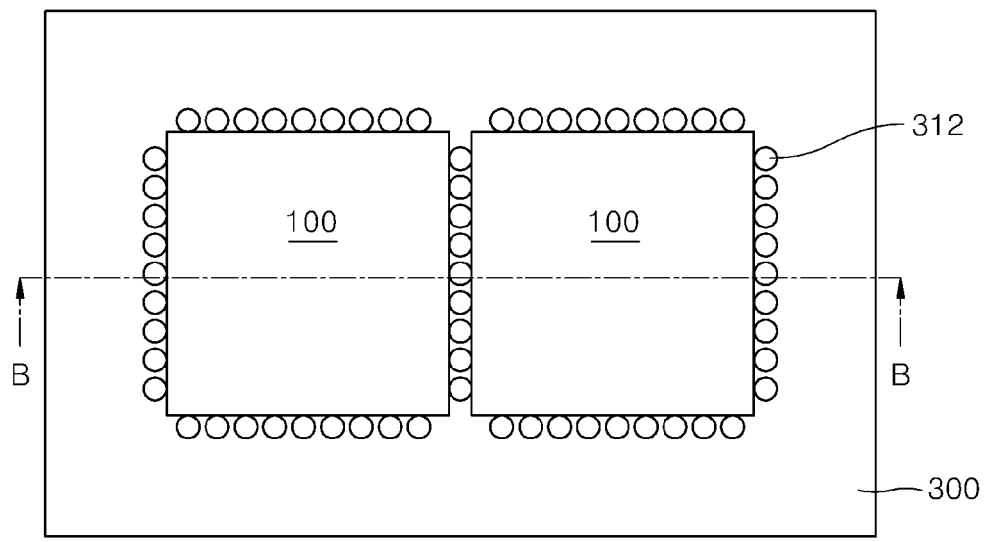
FIG. 18A is a plan view of a package incorporating a plurality of chips according to one embodiment.
Figure 18B:
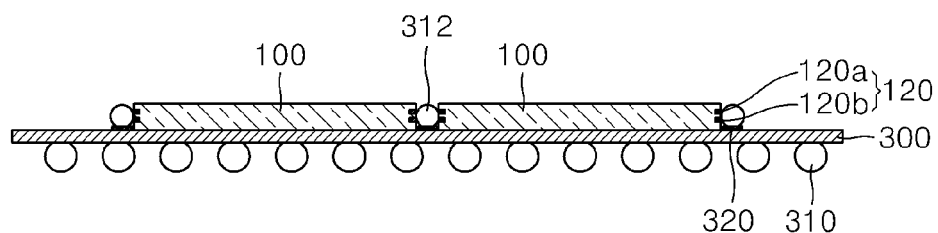
FIGS. 18B and 18C are cross-sectional views of exemplary embodiments of a package, taken along line "B" shown in FIG. 18A.
Figure 18C:
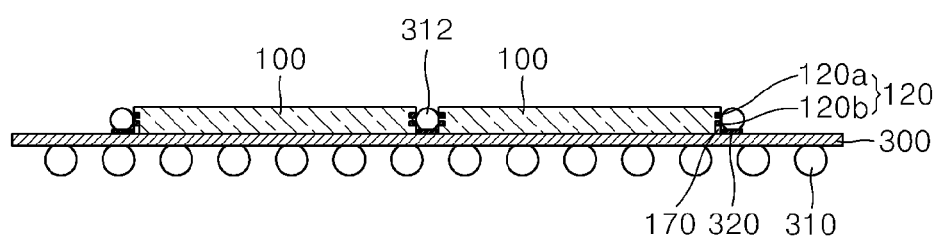
Figure 19:
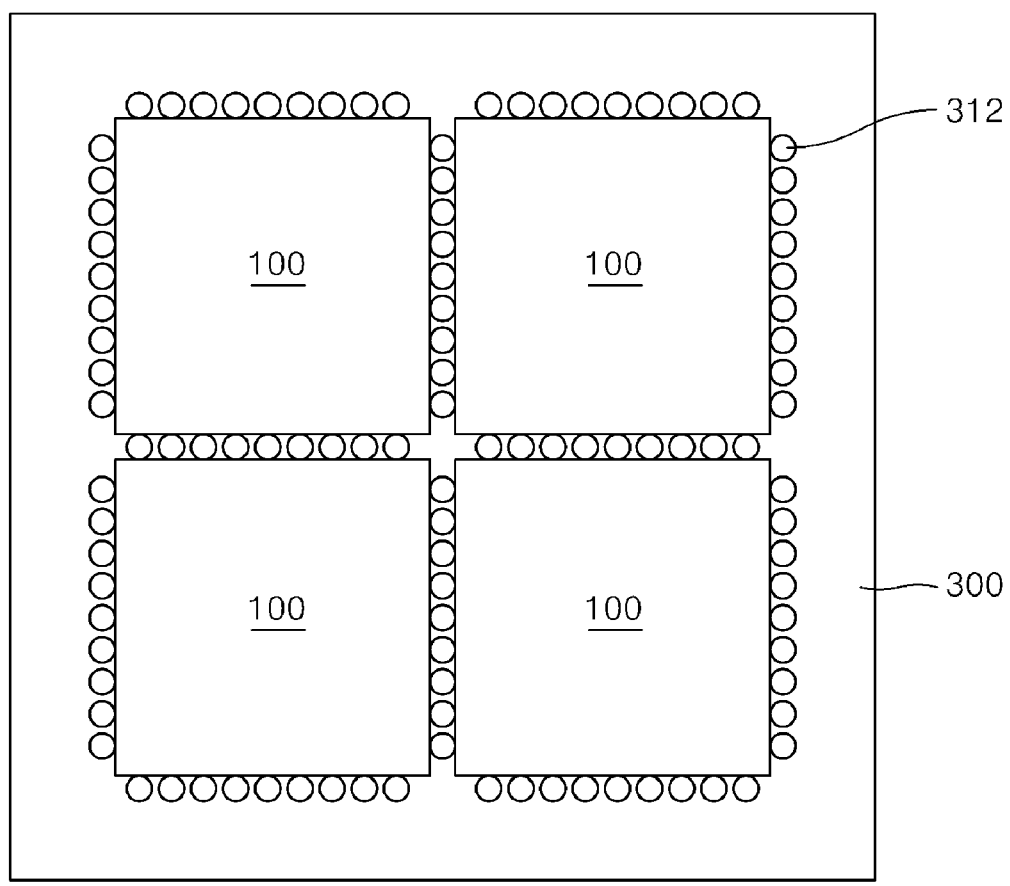
FIG. 19 is a plan view of a package incorporating a plurality of chips according to another embodiment.

FIG. 18A is a plan view of a package incorporating a plurality of chips according to one embodiment. FIGS. 18B and 18C are cross-sectional views of exemplary embodiments of a package, taken along line "B" shown in FIG. 18A. FIG. 19 is a plan view of a package incorporating a plurality of chips according to another embodiment.

Referring to FIGS. 18A and 18B, a package may, for example, be provided as a package similar to that described above with respect to FIG. 13B. Referring to FIG. 18C, a package may be similar to that described above with respect to FIG. 13C. In the illustrated embodiments, however, a plurality of first chips 100 may be arranged horizontally adjacent to each other on the circuit substrate 300. The plurality of first chips 100 may also be electrically and mechanically connected to each other via a plurality of conductive interconnects 312, in addition to being electrically and mechanically connected to the circuit substrate 300, via a plurality of conductive interconnects 312. In short, the package may be formed by providing a plurality of first chips 100 on the circuit substrate 300 and connecting portions of the lower and upper conductive patterns 120*b* and 120*a* exposed on the side surface 150 (i.e., side pads 120) of a first one of the first chips 100 with portions of the lower and upper conductive patterns 120*b* and 120*a* exposed on the side surface 150 (i.e., side pads 120) of an other one of the first chips 100 with conductive interconnects 312. Accordingly, each conductive interconnect 312 may, in one embodiment, connect portions of the lower and upper conductive patterns 120*b* and 120*a* exposed on a side surface 150 of a first one of the first chips 100 with portions of the lower and upper conductive patterns 120*b* and 120*a* exposed on a side surface 150 of another one of the first chips 100. In one embodiment, side surfaces 150 of adjacent ones of the first chips 100 may be spaced apart from each other (and electrically connected) by the conductive interconnects 312. As a result, the size (width) of the package can be reduced as the conductive interconnects 312 are commonly used by each of the first chips 100. Also, the circuits within each first chip 100 can be shared to reduce the overall size of the package.

It will be appreciated that the first chips 100 may be provided in any number and arrangement. For example, and with reference to FIG. 19, the package may be provided with four first chips 100 electrically and mechanically connected to each other via a plurality of conductive interconnects 312. Thus, the size of the chip and the package can be further reduced as they share the conductive interconnects 312 and the internal circuits between them. In one embodiment, the conductive interconnects 312 may include at least one of a conductive bump, a solder ball and solidified solder paste.

Figure 20A:
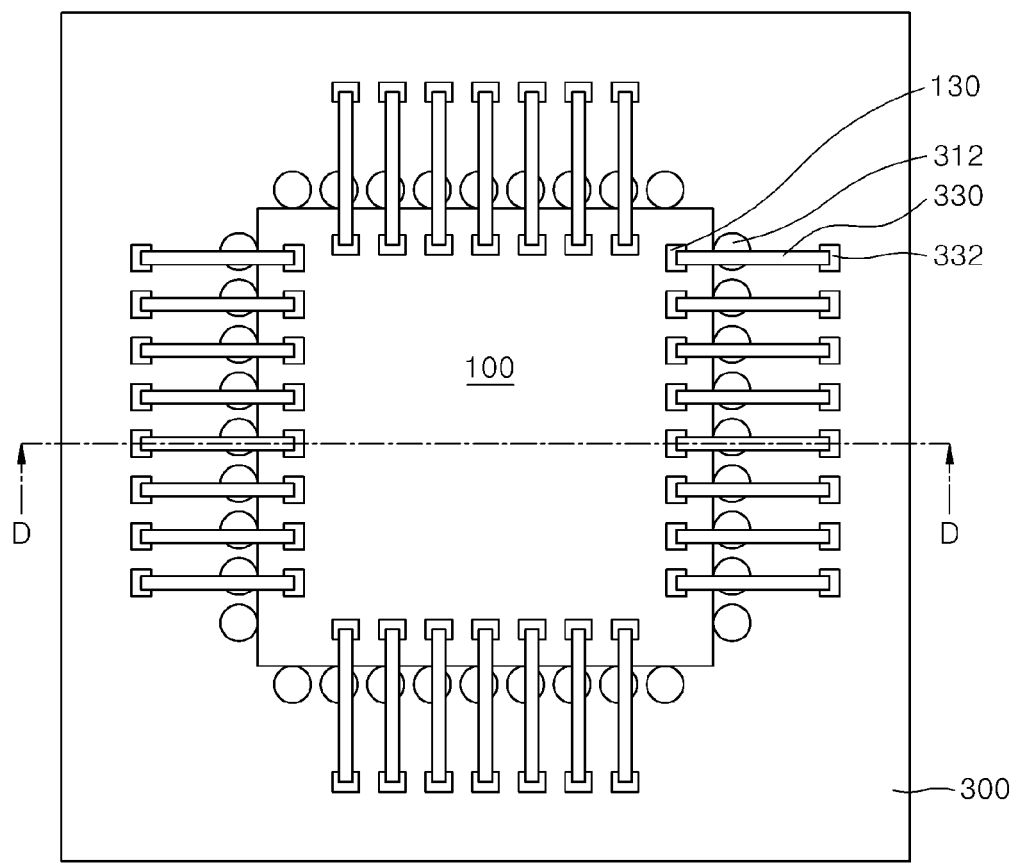
FIG. 20A is a plan view of a package incorporating chip according to another embodiment.
Figure 20B:
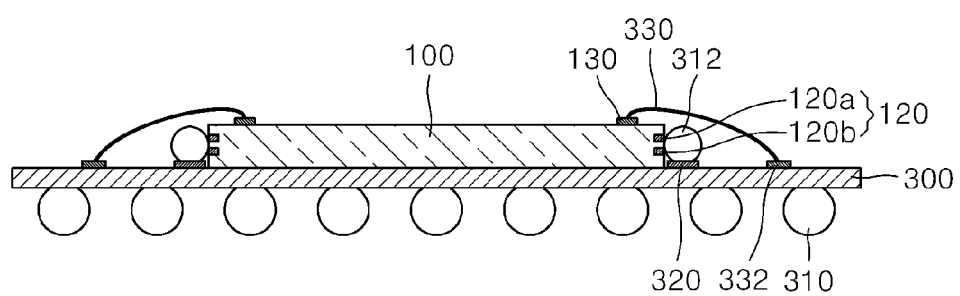
FIGS. 20B and 20C are cross-sectional views taken along line "D" shown in FIG. 20A, according to some embodiments.
Figure 20C:
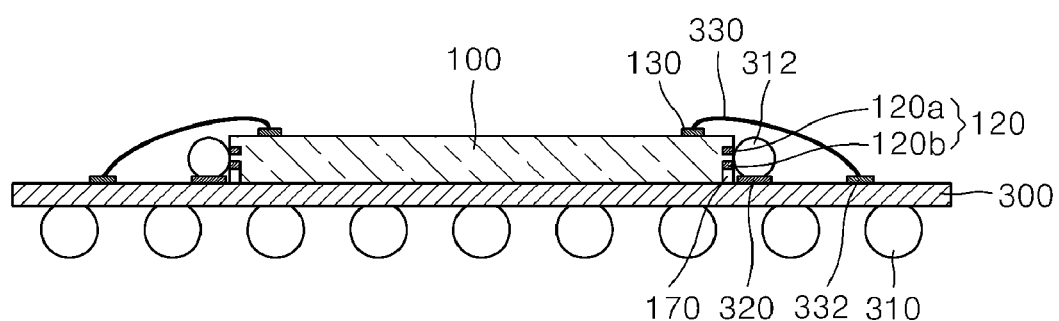
Figure 21A:
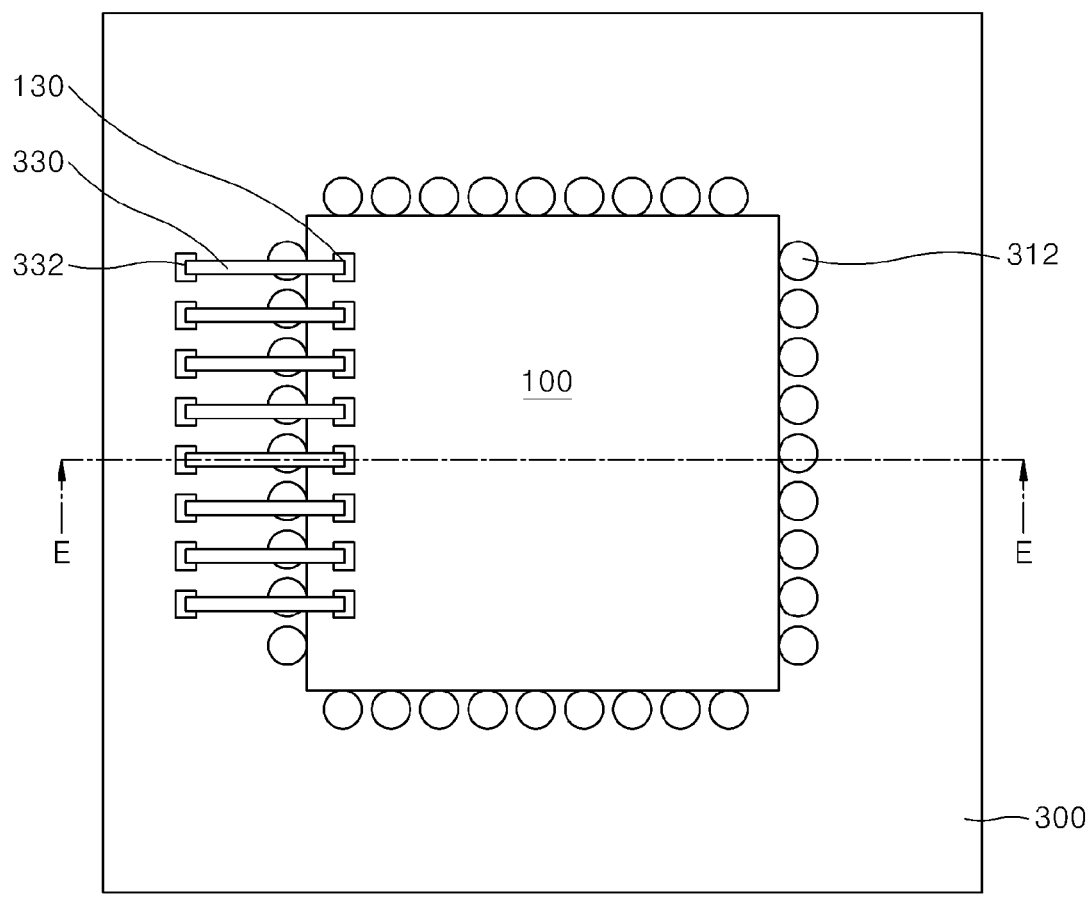
FIG. 21A is a plan view of a package incorporating a chip according to another embodiment.
Figure 21B:
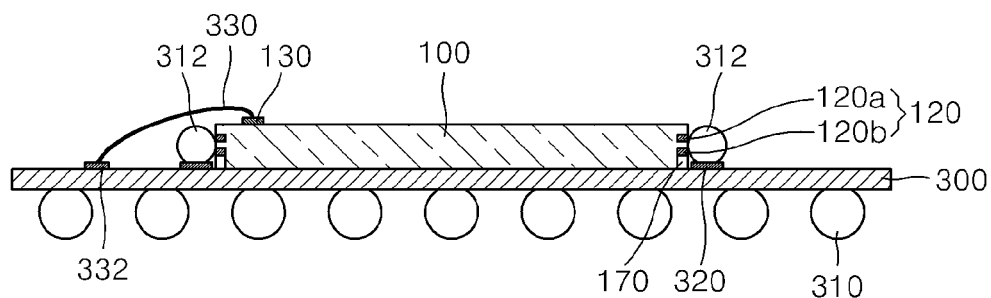
FIG. 21B is a cross-sectional view taken along line "E" shown in FIG. 21A, according to one exemplary embodiment.
Figure 22A:
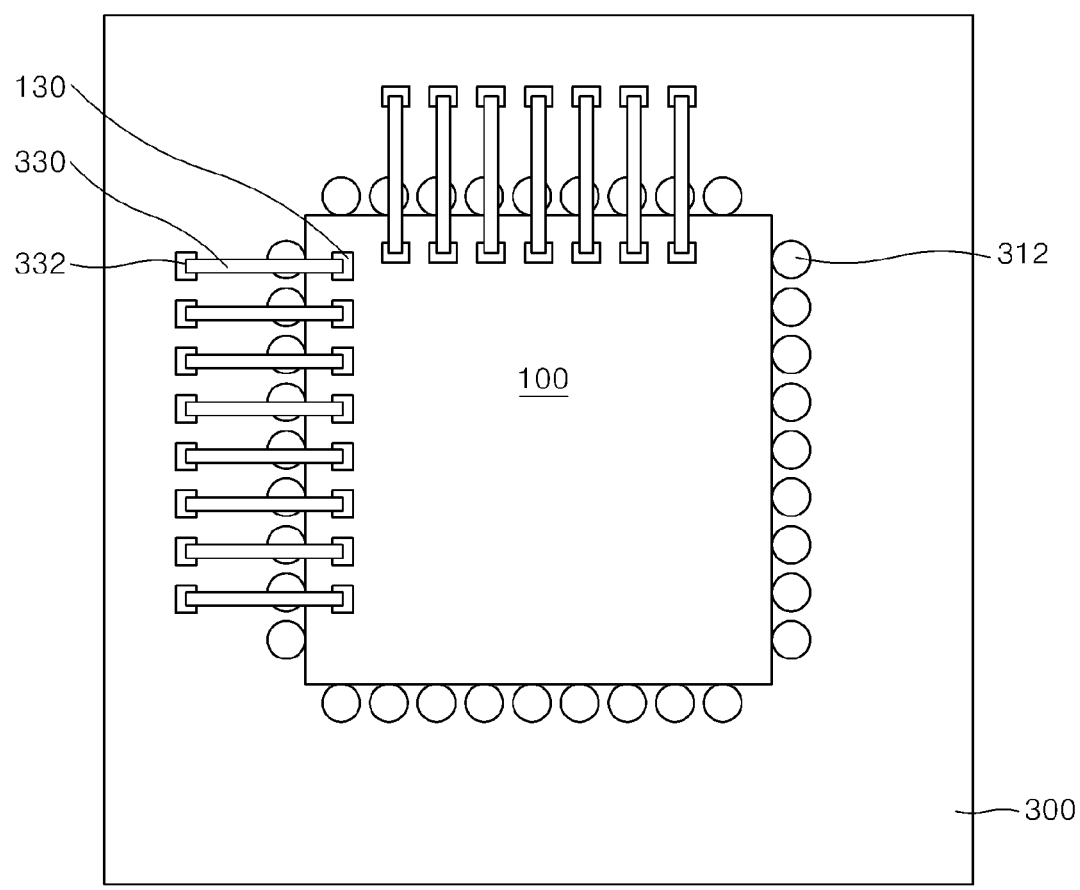
FIG. 22A-22C are plan views of packages incorporating a chip according to other embodiments.
Figure 22B:
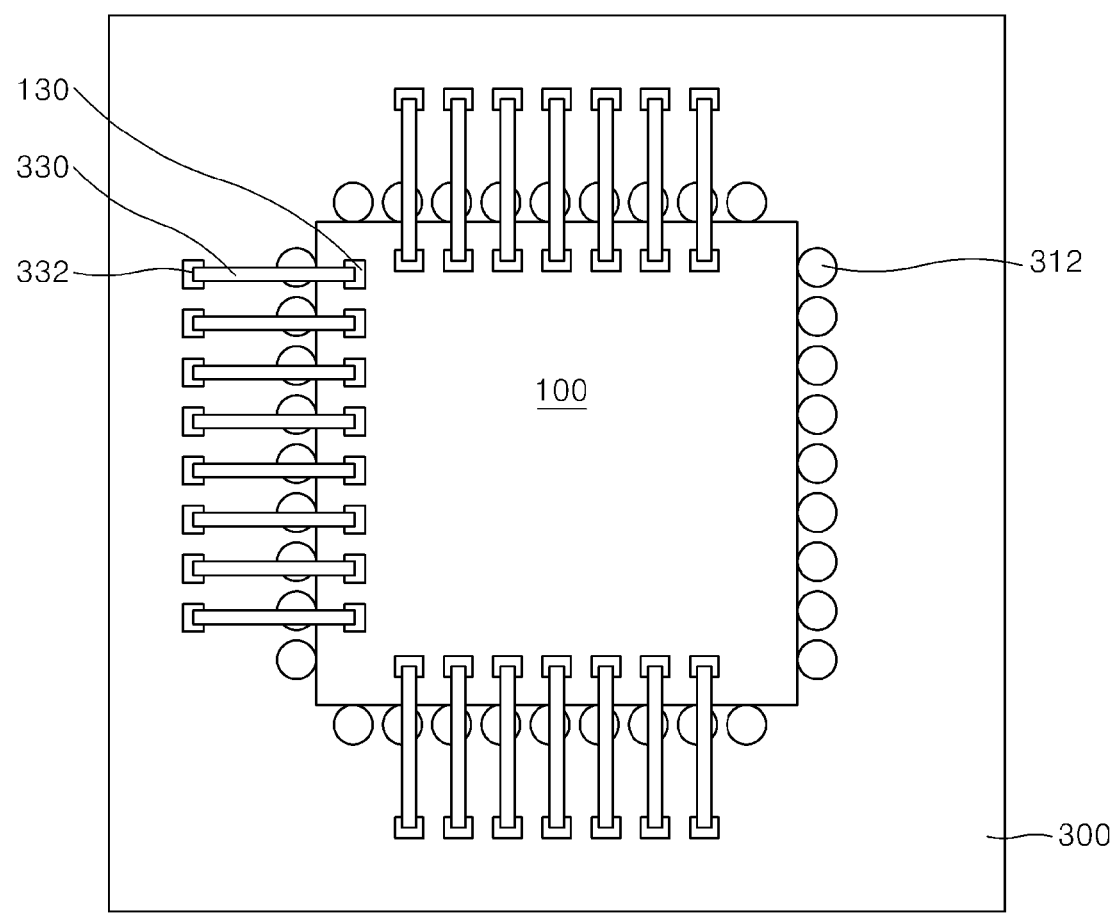
Figure 22C:
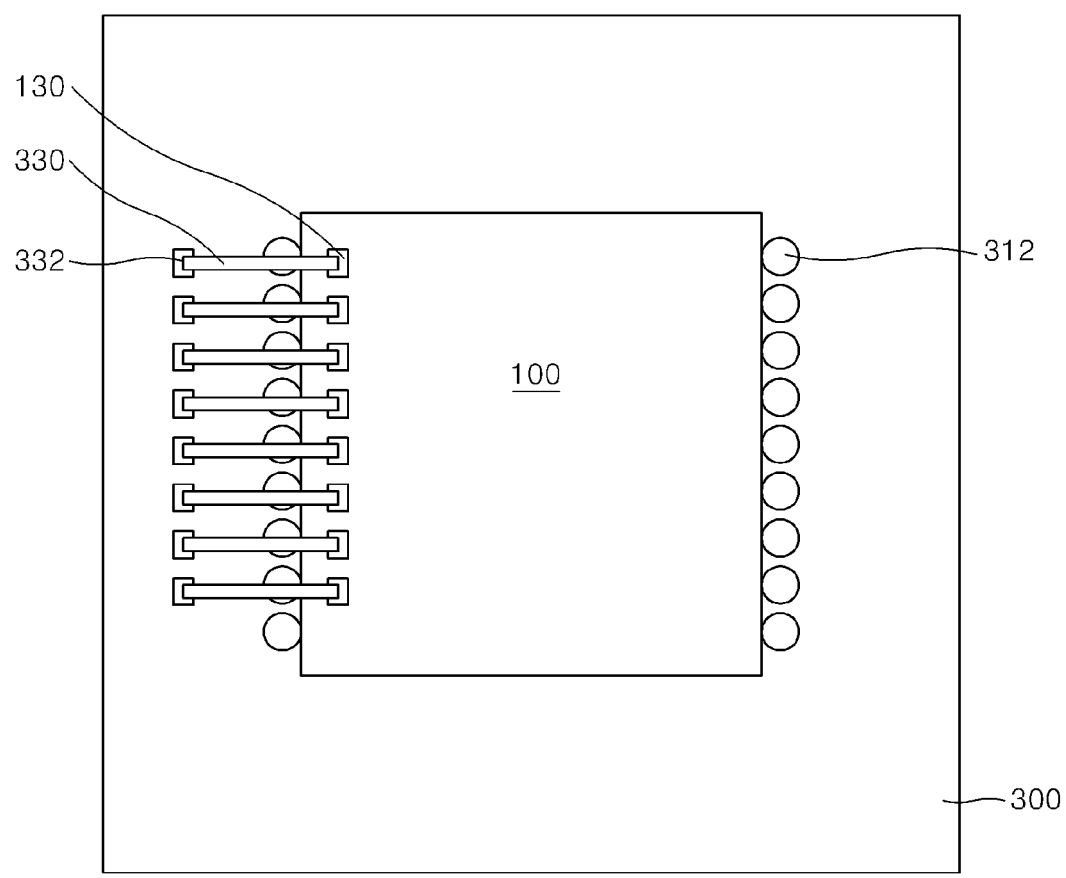

FIG. 20A is a plan view of a package incorporating a chip according to another embodiment. FIGS. 20B and 20C are cross-sectional views taken along line "D" shown in FIG. 20A, according to some embodiments. FIG. 21A is a plan view of a package incorporating a chip according to another embodiment. FIG. 21B is a cross-sectional view taken along line "E" shown in FIG. 21A, according to one exemplary embodiment. FIG. 22A-22C are plan views of packages incorporating a chip according to other embodiments.

Referring to FIGS. 20A and 20B, a package may, for example, be provided as a package similar to that described above with respect to FIG. 13B. Referring to FIG. 20C, a package may, for example, be provided as a package similar to that described above with respect to FIG. 13C. In the illustrated embodiment, however, the first chip 100 may further be provided with chip pads 130 formed on the top surface thereof and the circuit substrate 300 may further be provided with second circuit substrate pads 332. Accordingly, electrical interconnections 330 (e.g., bond wires) may electrically connect corresponding ones of the chip pads 130 with the second circuit substrate pads 332. In other words, a package may be formed by providing chip pads 130 on the top surface of the first chip 100 and connecting the second circuit substrate pads 332 to the chip pads 130 with at least one electrical interconnection 330.

The embodiments exemplarily illustrated in FIGS. 20A-20C include a relatively large number of input/output pads and may, therefore, be used in applications such as high-speed ICs and high density memory chips. Although FIGS. 20A-20C exemplarily illustrate a package in which a plurality of chip pads 130 are disposed along all sides of the first chip 100. Wires 330 electrically connect each chip pad 130 to a corresponding second circuit substrate pad 332, it will be appreciated that the chip pads 130 (and the wires 330) may be provided in any number and arrangement. For example, and with reference to FIGS. 21A and 21B, a package may be provided to include chip pads 130 disposed along a fraction of the sides of the first chip 100 while side pads 120 are provided at each side surface 150 of the first chip 100. While the first chip 100 illustrated in FIG. 21B is provided as described above with respect to FIG. 7, it will be appreciated that the first chip 100 may be provided as described above with respect to, for example, FIG. 2B, 5B or 9.

Referring to FIGS. 22A-22C, chip pads 130 may be disposed along more than one side of the first chip 100. Although FIGS. 20A-20C, 21A, 22A and 22B exemplarily illustrate a package in which a plurality of conductive interconnects 312 and, thus, the side pads 120, are disposed along all sides of the first chip 100, it will be appreciated that the conductive interconnects 312 and the side pads 120 may be provided in any number and arrangement. For example, and with reference to FIG. 22C, a package may be provided to include a plurality of conductive interconnects 312 and side pads 120 disposed along a pair of opposing sides of the first chip 100. Further, the package shown in FIG. 22C may be provided with the chip pads 130 disposed on only one side of the first chip 100.

Figure 23A:
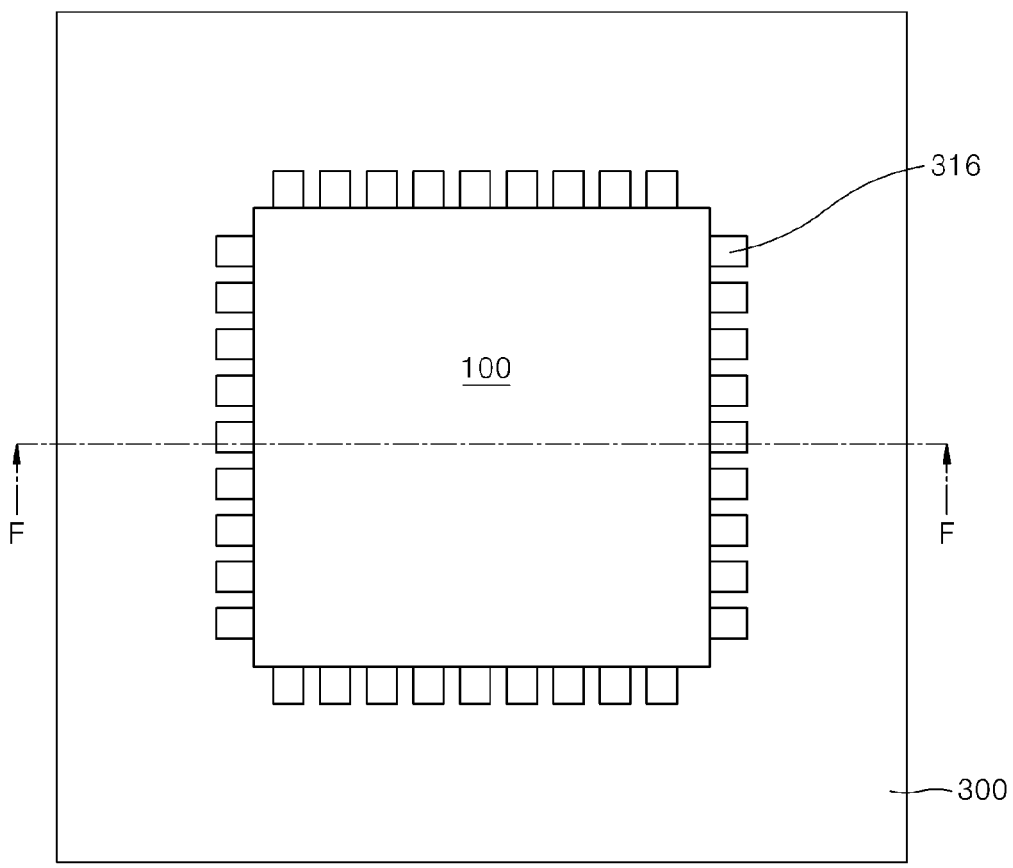
FIG. 23A is a plan view of a package incorporating chip according to yet another embodiment.
Figure 23B:
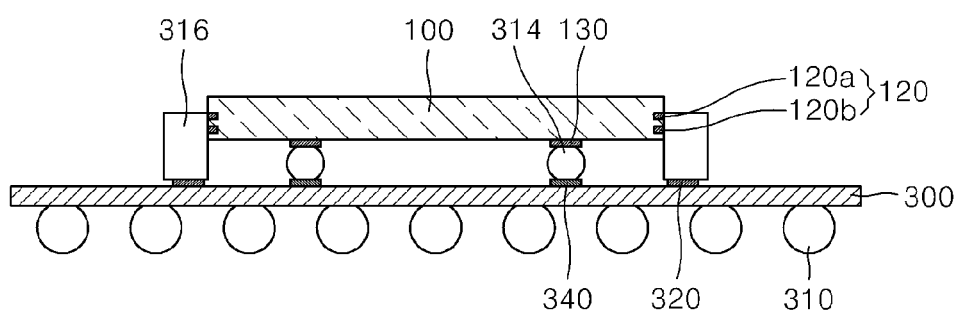
FIGS. 23B and 23C are cross-sectional views taken along line "F" shown in FIG. 23A, according to some exemplary embodiments.
Figure 23C:
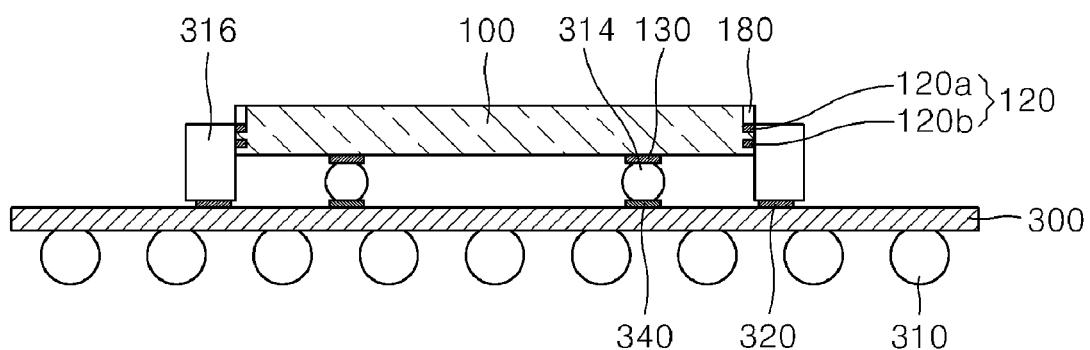

FIG. 23A is a plan view of a package incorporating chip according to yet another embodiment. FIGS. 23B and 23C are cross-sectional views taken along line "F" shown in FIG. 23A.

Referring to FIGS. 23A and 23B, a package may, for example, be provided as a package similar to that described above with respect to FIG. 13B. Referring to FIG. 23C, a package may, for example, be provided as a package similar to that shown in FIG. 23B but include a first chip 100 provided as described above with respect to FIG. 11 or any other suitable chip discussed here. In one embodiment, the conductive interconnect 316 shown in FIG. 23C may contact at least a portion of the conductive member 180. In the illustrated embodiments, however, the first chip 100 may be provided with the chip pads 130 disposed on its lower surface. Accordingly, side pads 120 of the first chip 100 may be electrically connected to first circuit substrate pads 320 via a plurality of substantially rectangular conductive interconnects 316 (see, for example, FIGS. 14A and 14B) and the chip pads 130 may be electrically connected to second circuit substrate pads 340 disposed on the circuit substrate 300 via electrical interconnections 314 (e.g., conductive balls, conductive bumps, solder balls, solder bumps, solder paste, anisotropic conductive film, metal, or the like or a combination thereof). In other words, a package may be formed by providing chip pads 130 on the bottom surface of the first chip 100 and connecting the second circuit substrate pads 340 to the chip pads 130 with at least one electrical interconnection 314.

According to the exemplary embodiments described above, side pads are exposed on side surfaces of a chip. By providing the side pads on a side surface of the chip, the length of signal paths between the conductive structures and the external devices can be reduced. By reducing the length of signal paths, problems associated with a signal delay can be reduced. Also, the interconnection between bonding pads and power or ground metallization can be reduced as the power or ground metallization can be connected to the side pads 120, which is located nearby, instead of being connected to the chip pads 130 disposed on a top of the chip 100, which is more remote.

In addition, by providing the side pads on the chip, the overall thickness of the package incorporating the chip can be reduced. Further, by having the side pads on a side surface of the chip, the design of the interconnections that connect various electrical components such as a transistor or a resistor can be made significantly easier compared to the prior art. Also, the design of metallization routing for power or ground lines can be made more flexible by utilizing the side pads as illustrated in the FIGS. 12A-12C.

Even when a total number of bonding pads are significantly increased, they can be easily accommodated without having to increase the size of the chip using side pads discussed in the present invention. In other words, with the embodiments of the present invention, a total number of chip pads can be significantly increased with the same chip real estate.

According to some embodiments, one skilled in art would appreciate that packages discussed herein would incorporate various semiconductor chips with side pads although all of such combinations are not discussed here.

While embodiments of the present invention have been particularly shown and described above, it will be understood by those of ordinary skill in the art that various changes in form and details may be made therein without departing from the spirit and scope of the present invention as defined by the following claims.

What is claimed is:

1. A semiconductor device, comprising:
 a first chip having a top surface, a bottom surface and a side surface connected to the top and bottom surfaces, wherein the first chip comprises:
  a chip substrate;
  a lower conductive pattern over the chip substrate;
  an interlayer dielectric layer over the lower conductive pattern;
  an upper conductive pattern over the interlayer dielectric layer;
  an electrical component over the chip substrate at a layer lower than the lower conductive pattern; and
 a conductive wiring pattern at the interlayer dielectric layer forming at least part of an electrical connection between the lower conductive pattern and the electrical component,
 wherein at least a portion of the lower conductive pattern and at least a portion of the upper conductive pattern are exposed on the side surface of the first chip to collectively form a side pad.

2. The semiconductor device of claim 1, wherein the portion of the upper conductive pattern exposed on the side surface of the first chip is disposed between the portion of the lower conductive pattern exposed on the side surface of the first chip and the top surface of the first chip.

3. The semiconductor device of claim 1, wherein the first chip further comprises an intermediate conductive pattern located between the lower and upper conductive patterns.

4. The semiconductor device of claim 3, wherein at least a portion of the intermediate conductive pattern is exposed on the side surface of the first chip.

5. The semiconductor device of claim 3, wherein the intermediate conductive pattern is a bar-type conductive pattern or a contact-type conductive pattern.

6. The semiconductor device of claim 1, further comprising:
 a circuit substrate having a first circuit substrate pad; and
 a conductive interconnect connecting the first circuit substrate pad to the portions of the lower and upper conductive patterns exposed on the side surface of the first chip.

7. The semiconductor device of claim 6, wherein the conductive interconnect has a substantially spherical shape, a substantially rectangular shape, a substantially triangular shape, or a concavely-bowed triangular shape.

8. The semiconductor device of claim 7, wherein the first chip comprises a conductive member exposed on the side surface of the first chip and electrically connected to the side pad of the first chip; and the conductive interconnect contacts at least a portion of the conductive member.

9. The semiconductor device of claim 6, wherein the circuit substrate includes a second circuit substrate pad, the semiconductor device further comprising:

a chip pad on at least one of the top and bottom surfaces of the first chip; and at least one electrical interconnection connecting the second circuit substrate pad to the chip pad.

10. The semiconductor device of claim 9, wherein the first chip comprises:

a plurality of side pads; and a plurality of side surfaces, wherein at least one side pad is exposed on at least two of the plurality of side surfaces, the semiconductor device further comprising:

a plurality of chip pads adjacent to the at least two of the plurality of side surfaces.

11. The semiconductor device of claim 9, wherein the chip pad is electrically connected to the side pad.

12. The semiconductor device of claim 6, further comprising:

a chip pad on the top surface of the first chip;

a second chip overlying the first chip; and an electrical interconnection connecting the second chip to the chip pad of the first chip.

13. The semiconductor device of claim 6, further comprising:

a plurality of first chips on the circuit substrate; and a conductive interconnect connecting portions of the lower and upper conductive patterns exposed on the side surface of a first one of the plurality of first chips with portions of the lower and upper conductive patterns exposed on the side surface of a second one of the plurality of first chips.

14. The semiconductor device of claim 13, wherein at least two of the plurality of first chips are arranged horizontally adjacent to each other on the circuit substrate.

15. The semiconductor device of claim 13, wherein at least two of the plurality of first chips are arranged vertically adjacent to each other on the circuit substrate.

16. The semiconductor device of claim 15, further comprising an adhesive layer between the at least two of the plurality of first chips arranged vertically adjacent to each other.

17. The semiconductor device of claim 15, wherein at least one of the at least two of the plurality of first chips comprises a conductive member; and at least a portion of the conductive member is exposed on the side surface of the at least one of the at least two of the plurality of first chips and is electrically connected to the side pad of the at least one of the at least two of the plurality of first chips.

18. The semiconductor device of claim 17, wherein a plurality of the at least two of the plurality of first chips comprises a conductive member; and conductive members of at least two vertically adjacent first chips directly contact each other.

19. The semiconductor device of claim 13, wherein the conductive interconnect comprises at least one of a conductive bump, a solder ball and solidified solder paste and wherein side surfaces of the first and second ones of the plurality of first chips are spaced apart by the conductive interconnect.

20. The semiconductor device of claim 1, wherein the first chip further comprises a conductive member located below the lower conductive pattern, wherein at least a portion of the conductive member is exposed on the side surface of the first chip and is electrically connected to the lower conductive pattern, wherein the first chip further comprises an intermediate conductive pattern located between the lower and upper conductive patterns.

21. The semiconductor device of claim 1, wherein the first chip further comprises a conductive member located above the upper conductive pattern, wherein at least a portion of the conductive member is exposed on the side surface of the first chip and is electrically connected to the upper conductive pattern, wherein the first chip further comprises an intermediate conductive pattern located between the lower and upper conductive patterns.

22. The semiconductor device of claim 1, wherein the first chip further comprises:

a plurality of side pads; and at least one conductive wiring pattern extending substantially horizontally along a plane substantially parallel to a surface of the chip substrate, wherein the at least one conductive wiring pattern electrically connects at least two of the plurality of side pads together.

23. The semiconductor device of claim 22, wherein the at least one conductive wiring pattern is disposed over the interlayer dielectric layer.

24. The semiconductor device of claim 1, wherein the first chip comprises:

a plurality of side pads; and a plurality of side surfaces, wherein at least one side pad is exposed on all of the plurality of side surfaces.

* * * * *